(12) United States Patent
Yanai et al.

(10) Patent No.: US 6,338,990 B1
(45) Date of Patent: *Jan. 15, 2002

(54) METHOD FOR FABRICATING THIN-FILM TRANSISTOR

(75) Inventors: Ken-ichi Yanai; Tsutomu Tanaka; Koji Ohgata; Yutaka Takizawa; Ken-ichi Oki; Takuya Hirano, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,050

(22) Filed: Oct. 23, 1998

Related U.S. Application Data

(62) Division of application No. 08/510,563, filed on Aug. 2, 1995, now Pat. No. 5,879,973, which is a division of application No. 08/102,248, filed on Aug. 5, 1993, now Pat. No. 5,470,768.

(30) Foreign Application Priority Data

| Aug. 7, 1992 | (JP) | 4-211491 |
| Aug. 10, 1992 | (JP) | 4-212554 |
| Aug. 10, 1992 | (JP) | 4-232656 |
| Jul. 22, 1993 | (JP) | 5-181063 |

(51) Int. Cl.⁷ .............................................. H01L 21/00
(52) U.S. Cl. .................... 438/160; 438/149; 438/161
(58) Field of Search ........................... 438/161, 158, 438/159, 160, 149, 151, 479, 482, FOR 183, FOR 200; 148/DIG. 150

(56) References Cited

U.S. PATENT DOCUMENTS

| 4,477,311 A | 10/1984 | Mimura et al. | 438/492 |
| 4,579,609 A | 4/1986 | Reif et al. | 438/974 |

(List continued on next page.)

FOREIGN PATENT DOCUMENTS

| EP | 0371854 | 6/1990 |
| EP | 0526779 | 2/1993 |
| JP | 5927575 | 2/1984 |

(List continued on next page.)

OTHER PUBLICATIONS

Selective Deposition and Bond Strain Relaxation in Silicon PECVD Using Time Modulated Silane Flow, G.N. Parsons et al., Japanese Journal of Applied Physics, Part 1, Jun. 1992, pp. 1943–1947, vol. 31, No. 6B.

(List continued on next page.)

*Primary Examiner*—Michael Trinh
(74) *Attorney, Agent, or Firm*—Staas & Halsey LLP

(57) ABSTRACT

To form a contact layer on source and drain electrodes of a stagger-type TFT, a conductive material is selectively sticked to the surface of the source and drain electrodes and a contact layer is selectively deposited by using the conductive material as growth species to form an active semiconductor layer on the contact layer. For an inverted-stagger-type TFT, a conductive material is selectively deposited on the surface of a contact layer to use the selectively deposited conductive material as source and drain electrodes so that patterning is unnecessary. To selectively deposit a contact layer of a TFT by alternately repeating etching and deposition, the temperature for the etching is set to 200° C. or lower. A contaminated layer on the surface of a semiconductor film serving as an active semiconductor layer and contact layer of a TFT is removed by plasma at the temperature of 200° C. or lower. For a stagger-type thin-film transistor, the hydrogen or halogen content of an insulating film serving as the substrate of source and drain electrodes is increased. For an inverted-stagger thin-film transistor, the hydrogen or halogen content of an insulating film serving as a channel protective film is increased. Thus, the etching rate of the surfaces of these insulating films by plasma increases.

11 Claims, 36 Drawing Sheets

U.S. PATENT DOCUMENTS

| | | | |
|---|---|---|---|
| 4,778,560 A | | 10/1988 | Takeda et al. ............... 438/158 |
| 4,788,157 A | * | 11/1988 | Nakamura .................. 438/160 |
| 4,800,174 A | | 1/1989 | Ishihara et al. ............. 438/485 |
| 4,842,897 A | | 6/1989 | Takeuchi et al. .............. 438/96 |
| 4,849,375 A | | 7/1989 | Gluck et al. ................ 438/723 |
| 4,859,617 A | | 8/1989 | Nomoto et al. ............. 438/158 |
| 4,880,475 A | | 11/1989 | Lindmayer ................... 427/69 |
| 4,880,753 A | | 11/1989 | Meakin et al. ............... 438/151 |
| 5,151,384 A | | 9/1992 | Williams .................... 438/488 |
| 5,166,086 A | * | 11/1992 | Takeda et al. ................ 438/30 |
| 5,194,398 A | | 3/1993 | Miyachi et al. ............. 438/482 |
| 5,221,643 A | | 6/1993 | Griep ........................ 438/488 |
| 5,238,866 A | | 8/1993 | Bolz et al. .................. 438/483 |
| 5,242,530 A | | 9/1993 | Batey et al. ............... 438/485 |
| 5,252,181 A | | 10/1993 | Dutartre et al. ............... 216/69 |
| 5,286,659 A | * | 2/1994 | Mitani et al. ............... 438/149 |
| 5,288,658 A | | 2/1994 | Ishihara ..................... 438/485 |
| 5,413,954 A | | 5/1995 | Aydil et al. ................... 117/97 |

FOREIGN PATENT DOCUMENTS

| | | | | |
|---|---|---|---|---|
| JP | | 5927576 | 2/1984 | |
| JP | | 61182266 | 8/1986 | |
| JP | | 6242565 | 2/1987 | |
| JP | | 62299941 | 12/1987 | |
| JP | | 63044628 | 2/1988 | |
| JP | | 01259320 | 10/1989 | |
| JP | | 0465120 | 3/1992 | |
| JP | | 4-360542 | * 12/1992 | ........ 438/FOR 183 |
| JP | | 0562913 | 3/1993 | |

OTHER PUBLICATIONS

Selective Tungsten on Silicon by the Alternating Cyclic, AC, Hydrogen Reduction of WF/sub 6/', A. Reisman et al., Journal of the Electrochemical Society, Feb. 1990, USA, vol. 137, No. 2, pp. 723–727.

Enhanced Mobility Top–Gate Amorphous Silicon Thin –Film Transistor with Selectively Deposited Source/Drain Contacts, G.N. Parsons, IEEE Electron Device Letters, Feb. 1992, USA, vol. 13, N. 2, pp. 80–82, ISSN 0741–3106, XP246197.

Selective Deposition of Silicon by Plasma–Enhanced Chemical Vapor Deposition Using Pulsed Silane Flow, G.N. Parsons, Applied Physics Letters, Nov. 11, 1991, USA, vol. 59, NR. 20, pp. 2546–2548, ISSN 0003–6951, SP350206.

* cited by examiner

SAMPLE 1

SAMPLE 2

SAMPLE 3

METHOD FOR FABRICATING THIN-FILM TRANSISTOR

This application is a Divisional of Application Ser. No. 08/510,563 filed Aug. 2, 1995, now U.S. Pat. No. 5,879,973, which is a Divisional of application Ser. No. 08/102,248 filed Aug. 5, 1993, now U.S. Pat. No. 5,470,768.

BACKGROUND OF THE INVENTION

1. Field of the Invention

The present invention relates to a method for fabricating a thin-film transistor, particularly to a method for forming a driver element of an active-matrix-drive liquid crystal display device.

2. Description of the Related Art

An active-matrix-drive liquid crystal display device and a direct-multiplex-drive liquid crystal display device are used as a display unit for a terminal of an information processing equipment or the like.

Because the active-matrix-drive liquid crystal display device independently drives each of many picture elements, it does not decrease the liquid-crystal driving duty ratio, contrast, or viewing angle differently from the simple matrix type even if the number of scanning lines increases due to increase of the information content to be displayed.

Therefore, the active matrix type provides color display equivalent to that of a cathode ray tube (CRT) and is more widely used as a thin flat display.

A thin-film transistor (hereafter referred to as TFT) is used as an element for driving a picture element electrode of the active-matrix-drive liquid crystal display device having the above advantage.

The TFT is divided into the stagger type shown in FIG. 1 and the inverted stagger type shown in FIG. 4 because of their structural difference.

The stagger-type TFT, as shown in FIG. 1, comprises a light-shielding film 2 formed in a TFT region on a transparent substrate 1, an insulating film 3 covering the light-shielding film 2, a source electrode 4s and a drain electrode 4d formed on the insulating film 3, a contact layers 5s and 5d formed on the source electrode 4s and drain electrode 4d, an active semiconductor layer 6 formed from the top of the two contact layers 5s and 5d to the region between them, and a gate electrode 8 formed on the active semiconductor layer 6 through a gate insulating film 7.

The light-shielding film 2 is formed to prevent light from entering a channel region layer of the active semiconductor layer 6 but it is unnecessary in some cases.

The insulating film 3 is formed between the light-shielding film 2 and the active semiconductor layer 6 so as to entirely cover the substrate 1.

The source electrode 4s and drain electrode 4d formed on the insulating film 3 are made of, for example, an indium-tin oxide film (hereafter referred to as ITO film). The contact layers 5s and 5d are made of an $n^+$ amorphous silicon film (hereafter referred to as a-Si film) and phosphorus is introduced into the a-Si film. The active semiconductor layer 6 serving as the channel region is made of amorphous silicon.

The source electrode 4s and drain electrode 4d and the contact layers 5s and 5d are formed by pattering the ITO film and a-Si film 5. Patterning of them is, as shown in FIG. 2A, performed by using a patterned resist film 10 as a mask and etching the ITO film 4 and a-Si film 5 exposed from the resist film 10. In this patterning step, the ITO film 4 exposed from the resist film 10 is over-etched so that it does not remain on the insulating film 3. Therefore, as shown in FIG. 2A, at the ends of the source electrode 4s and drain electrode 4d, facing each other (portions A in FIG. 2A), the ITO film 4 constituting these electrodes is side-etched and therefore the a-Si film 5 on the ITO film 4 is overhung. The overhung film 5 causes the thickness of the a-Si film 6 serving as the active semiconductor layer 6 to decrease or the film 6 to be cut, causing the TFT to malfunction.

To prevent the above phenomenon from occurring, a method is considered to pattern the ITO film 4 and thereafter pattern the a-Si film serving as a contact layer as shown in FIG. 3A. For this method, however, it is difficult to adjust a pattern of the ITO film 4 to that of the a-Si film 5 and the ITO film 4 may be exposed at the channel region because these films are formed stepwise. And, as shown in FIG. 3B, when an a-Si film 7b serving as the active semiconductor layer 6 is entirely formed on the stepwise region, silicon on the ITO film 4 exposed from the contact layers 5s and 5d may be abnormally deposited and the abnormal deposition impairs transistor characteristics.

Even if the abnormal deposition is avoided, the resist or etching solution used to pattern the ITO film 4 may remain on the surface of the ITO film 4 or contact layers 5s and 5d. Thereby, the surface of the ITO film 4 or a-Si film 5 is contaminated. This causes a problem that the surface imperfectly contacts a film formed on the surface.

To solve the above problem, a method for selectively depositing silicon on a conductive film is proposed in the following literatures.

[1] G. N. Parsons, Appl. Phys. Lett. 59 (1991) pp. 2546–2548

[2] G. N. Parsons, IEEE Electron Device Lett. Vol. 13 (1992) pp. 80–82

In these literatures, an art is proposed to selectively deposit silicon on a source electrode and a drain electrode as a contact layer. If selective deposition is smoothly performed, neither overhanging nor stepwise region previously mentioned do not occur on an ITO film. The deposition temperature shown in these literatures ranges from 250 to 300° C.

The inverted-stagger-type TFT, as shown in FIG. 4, comprises a gate electrode 12 formed on a transparent substrate 11, a gate insulating film 13 covering the gate electrode 12, an active semiconductor layer 14 covering the gate insulating layer 13, a channel protective coat 15 formed on the active semiconductor layer 14 above the gate electrode 12, and a source electrode 16s and a drain electrode 16d divided on the channel protective coat 15 and formed on the active semiconductor layer 14. Moreover, contact layers 17s and 17d are formed between the source electrode 16s and the active semiconductor layer 14 and between the drain electrode 16d and the active semiconductor layer 14. The gate electrode 12 and channel protective coat 15 are formed in almost same size.

The source electrode 16s and drain electrode 16d are made of a Ti film, the contact layers 17d and 17d are made of $n^+$-type a-Si, the active semiconductor layer 14 is made of a-Si.

The following are steps of forming the source electrode 16s, drain electrode 16d, and contact layers 17s and 17d of the inverted-stagger-type TFT.

As shown in FIG. 5A, an $n^+$-type a-Si film 17 and a Ti film 18 are laminated and thereafter a resist film 19 is applied onto the Ti film 18. Then, the resist film 19 is exposed by using an exposure mask PM and it is developed to form a pattern for forming a source and drain. Then, as shown in FIG. 5B, the Ti film 18 and n+-type a-Si film 17 are patterned by using a resist film 19 as a mask.

In this patterning, a margin is given to the pattern of the resist film 19 so that the pattern overlaps with the both sides of the channel protective coat 15 because it is difficult to adjust the edges of the source electrode 16s and drain electrode 16d to the edge of the gate electrode 12.

As a result, the gate electrode 12, as shown in FIG. 5B, has the width Lsd for securing a channel region and the margin width "ΔL×2" where the source electrode 16s overlaps with the drain electrode 16d. Thus, the channel length Lg comes to a value close to Lg=Lsd+2ΔL.

The parasitic capacity of the TFT increases due to the margin ΔL. When the parasitic capacity increases, it is also necessary to increase a storage capacity connected to the TFT in order to prevent a static screen of a liquid crystal display device from being baked and the increase of the storage capacity causes the opening rate to decrease.

To solve the problem, a method is considered to form the source electrode 16s and drain electrode 16d in self-alignment by using the lift-off method.

For example, in FIG. 6A, an n+-type a-Si film 21 and a Ti film 22 are formed by leaving the resist pattern 20 used to pattern the channel protective coat 15 as it is, and thereafter the resist pattern 20 is removed as shown in FIG. 6B. As a result, the resist pattern 20, a-Si film 21, and Ti film 22 on the channel protective coat 15 are removed and a laminated film of the a-Si film 21 and Ti film 22 are left on the active semiconductor layer 18 at the both sides of the channel protective coat 15. Thus, the source electrode 16s and drain electrode 16d are formed at the both sides of the gate electrode 12 in self-alignment.

However, this method has problems that the residue of the resist pattern 20 attaches to the Ti film 22 at the both sides of the channel protective coat 15 and that of the a-Si film 21 and Ti film 22 removed from the channel protective coat 15 attaches onto the transparent substrate 11. Though the TFT is covered with a not-illustrated final protective coat, a plurality of picture-element electrodes may be shorted unless the residue of the resist pattern 20 is removed.

As a pretreatment for forming a film, a method for cleaning a base material by exposing it to hydrogen plasma is disclosed in the official gazettes of [3] U.S. Pat. No. 4,477,311, [4] U.S. Pat. No. 4,579,609, and [5] U.S. Pat. No. 4,849,375. However, because these literatures do not describe cleaning of a substrate and film when an ITO film is exposed, it is necessary to study the method before applying it to fabrication of a TFT.

SUMMARY OF THE INVENTION

It is an object of the present invention to provide a method for fabricating a stagger-type thin-film transistor to form an active semiconductor film which is not cut off in the vicinity of a channel region.

It is another object of the present invention to provide a method for fabricating a thin-film transistor to eliminate contamination in forming source and drain electrodes and clean the interface between layers from an active semiconductor layer to source and drain electrodes.

It is still another object of the present invention to provide a method for fabricating a thin-film transistor for efficiently and selectively depositing a contact layer formed between source or drain electrode and an active semiconductor layer.

The present invention selectively sticks a conductive material to the surface of source and drain electrodes of a stagger-type thin-film transistor and selectively deposits semiconductor by using the conductive material as growth species to form a contact layer.

Thus, no step shape occurs at the edges of the contact layer and the source and drain electrodes, and moreover, selectivity increases and the selective deposition efficiency is improved because the conductive material serves as growth species.

To form source and drain electrodes of an inverted-stagger-type thin-film transistor, a conductive material is selectively deposited on the surface of a contact layer to form source and drain electrodes with a film made of the conductive material. By selectively depositing source and drain electrodes, contamination of a thin-film transistor due to patterning is eliminated. The means for forming a contact layer includes a method for selectively forming an impurity-contained semiconductor film on an active semiconductor layer at the both sides of an insulting channel protective film and a method for introducing impurities into the active semiconductor layer.

For another invention of the present invention, when selectively depositing a semiconductor film serving as a contact layer by alternately repeating etching and deposition, the temperature for the etching is 200° C. or lower and the deposition temperature is set to a value equal to that for the etching or higher. When lowering the temperature in the case of etching, the efficiency for selective deposition of a film is improved because the etching rate increases.

A contaminated layer on the surface of a semiconductor film serving as an active semiconductor layer and contact layer is removed by hydrogen or halogen plasma at the temperature of 200° C. or lower. At this temperature, the film quality of the semiconductor layer is prevented from degrading and an electrode exposed from the semiconductor film is prevented from deteriorating due to plasma.

For still another invention of the present invention, when selectively forming an impurity-contained semiconductor film serving as a contact layer, the hydrogen or halogen content of a substrate insulator of source and drain electrodes is increased for a stagger-type thin-film transistor and the hydrogen or halogen content of an insulating film serving as a channel protective film is increased for an inverted-stagger-type thin-film transistor. Thus, in the case of selective deposition, the semiconductor film sticked on the surfaces of the substrate insulator and channel protective film is easily etched and the selective deposition time is decreased.

DESCRIPTION OF THE PREFERRED EMBODIMENTS

Figure 1:
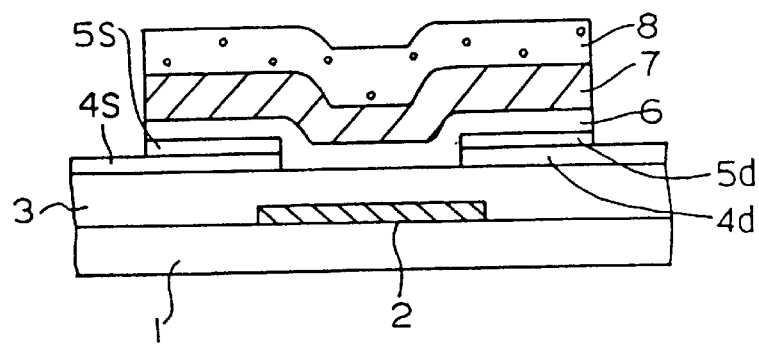
FIG. 1 is a sectional view showing the structure of a general stagger-type TFT.
Figure 4:
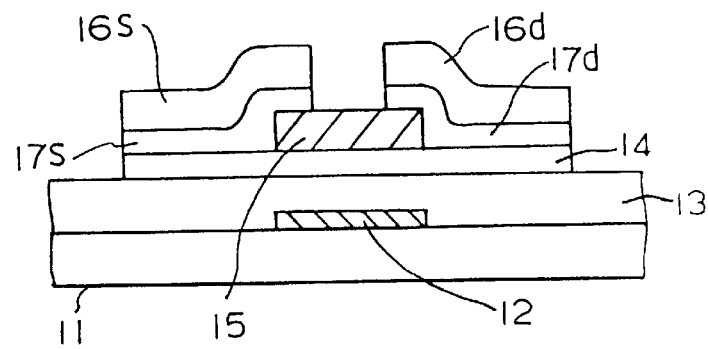
FIG. 4 is a sectional view showing the structure of a general inverted-stagger-type TFT.
Figure 2A:
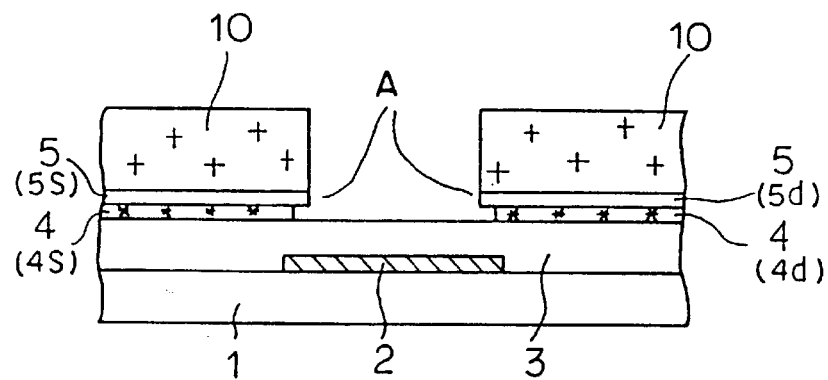
FIGS. 2A and 2B are sectional views for explaining a first problem in the step of fabricating a stagger-type TFT.
Figure 2B:
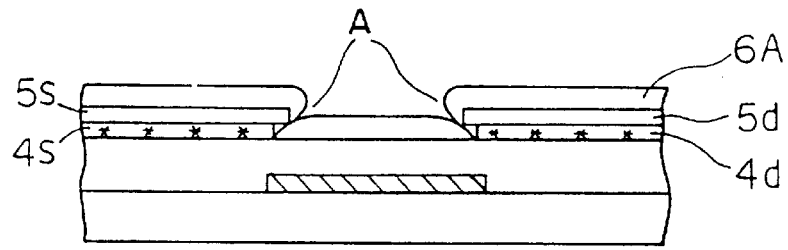
Figure 3A:
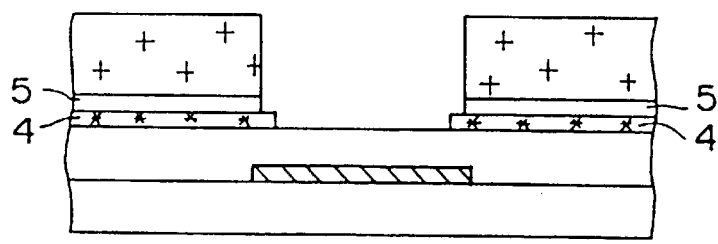
FIGS. 3A and 3B are sectional views for explaining a second problem in the step of fabricating a stagger-type TFT.
Figure 3B:
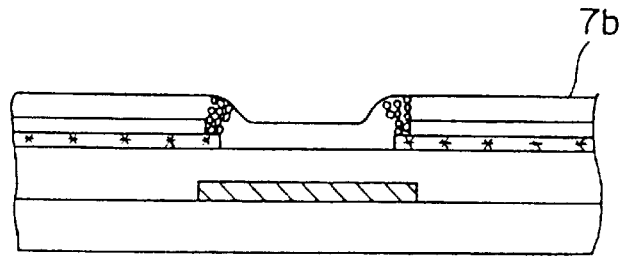
Figure 5A:
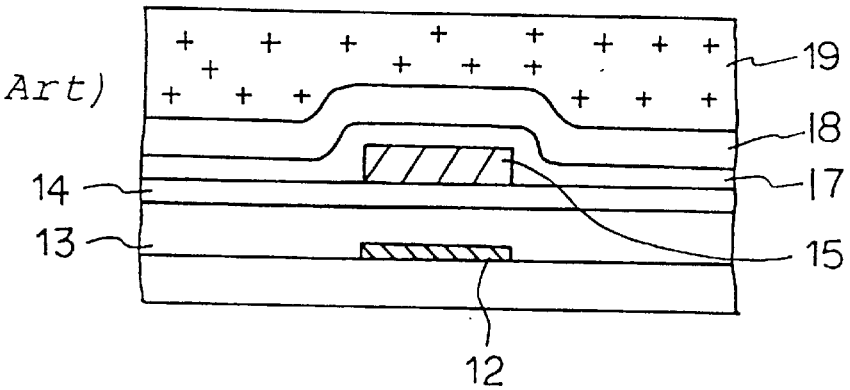
FIGS. 5A and 5B are sectional views for explaining a first problem in the step of fabricating a inverted-stagger-type TFT.
Figure 5B:
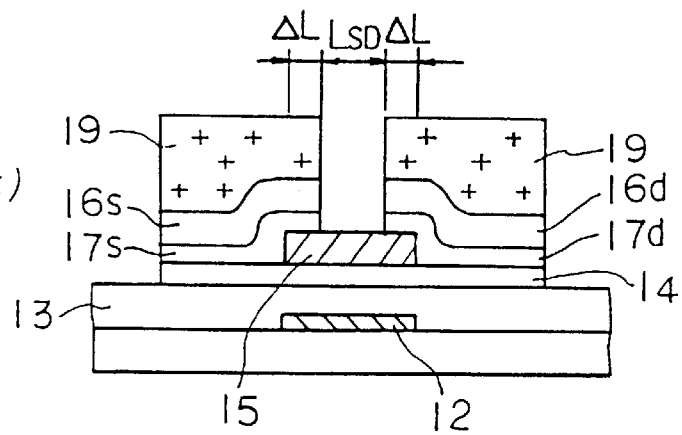
Figure 6A:
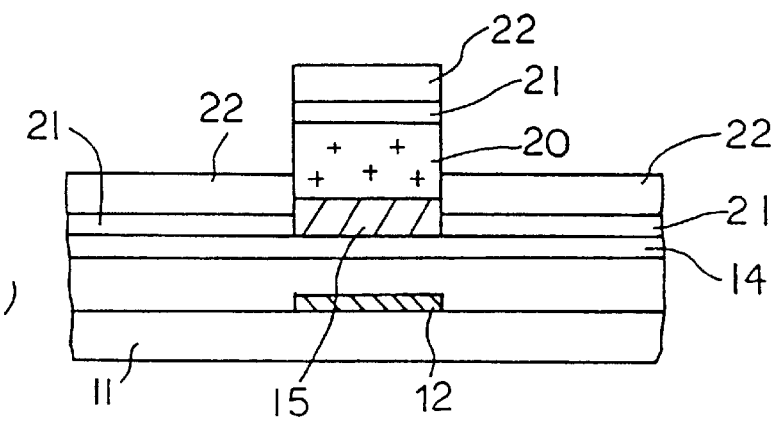
FIGS. 6A and 6B are sectional views for explaining a second problem in the step of fabricating a inverted-stagger-type TFT.
Figure 6B:
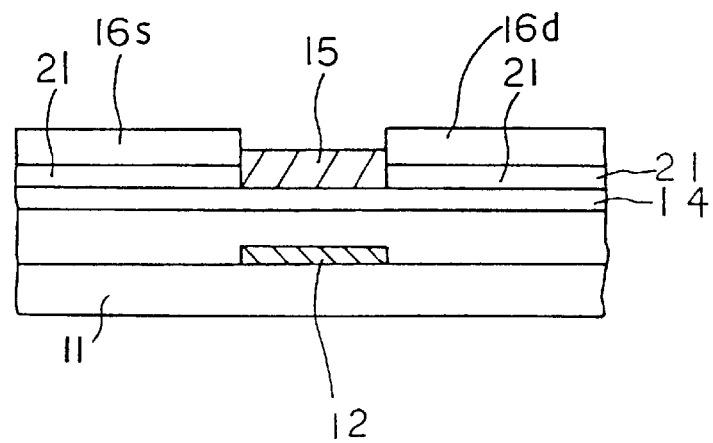
Figure 7A:
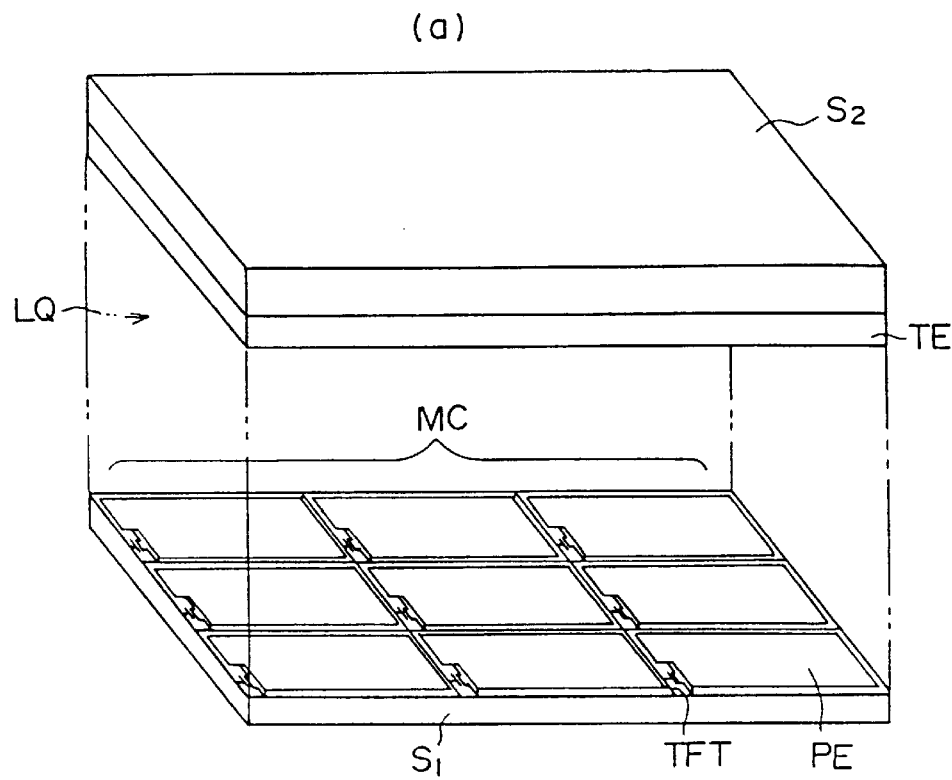
FIG. 7A is a perspective view for explaining the constitution of an active-matrix-drive liquid crystal display device of an embodiment of the present invention.
Figure 7B:
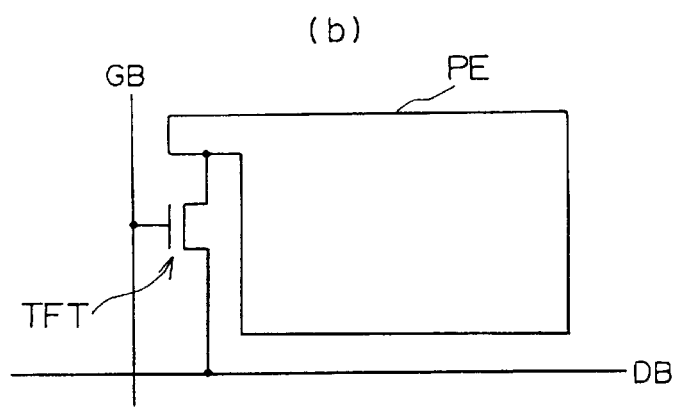
FIG. 7B is a top view of a TFT for driving one picture element of the display unit.

Before describing the embodiments, the general structure of a liquid crystal display device comprising a TFT is described by referring to FIGS. 7A and 7B. For the liquid crystal display device, as shown in FIG. 7A, the top surface of a first insulting transparent substrate $S_1$ and the bottom surface a second insulating transparent substrate $S_2$ are arranged so that they face each other, where a matrix circuit MC is formed on the top surface of the first insulating transparent substrate $S_1$ and a transparent electrode TE is formed on the bottom surface of the second insulating transparent substrate $S_2$. Moreover, a liquid crystal LQ is set between the transparent electrode TE and matrix circuit MC.

The matrix circuit MC comprises a plurality of thin-film transistors (hereafter referred to as TFTs) arranged on the first insulating transparent substrate $S_1$ and a plurality of transparent picture-element electrodes PE to be pared with TFTs respectively. The gate of a TFT is, as shown in FIG. 7B, connected to a gate bus line GB extending in one direction, the drain of the TFT is connected to a drain bus line DB extending in the direction orthogonal to the gate bus line, and the source of the TFT is connected to a picture element electrode PE. The gate bus line GB is insulated from the drain bus line DB by a not-illustrated insulating film.

Thus, display of an image is realized by changing the light transmission direction of the liquid crystal LQ on picture elements according to a signal voltage applied between the picture-element electrode PE and transparent electrode TE. The gate bus line GB is also referred to as a scan bus line and the drain bus line DB is also referred to as a data bus line.

(1) First Embodiment

First, a film forming system used for forming a contact layer of a TFT is described below by referring to FIG. 11.

The film forming system has a gas introduction port 72, exhaust port 74, and wafer holder 75 also serving as an electrode, and an electrode 76 in a chamber 71, in which an earth GND is connected to the wafer holder 75 and a power supply 77 for supplying radio-frequency power is connected to an electrode 76.

The gas introduction port 72 introduces a reaction gas into the chamber 71, which is integrated with the electrode 76. The wafer holder 75 supports a wafer W on which a film is to be formed and simultaneously serves as an electrode (negative electrode) for transforming the gas in the chamber 71 into plasma, and connects with the earth GND. Moreover, it stores a heater.

The electrode 76 is arranged to transform the gas in the chamber 71 into plasma by pairing with the wafer holder 75 and connected to the power supply 77. The power supply 77 supplies the radio-frequency power of 13.56 Mhz. It is also possible to connect the electrode 75 to the earth GND to supply the radio-frequency power to the wafer holder 76 by using a selector switch for switching the connections between the earth GND and power supply 77.

Then, the step of fabricating the stagger-type TFT of this embodiment is described below by referring to FIGS. 8A to 8H.

Figure 8A:
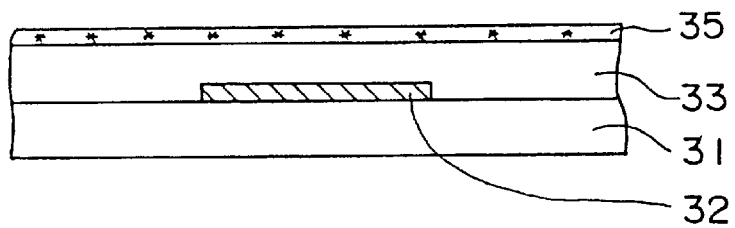
FIGS. 8A to 8G are sectional views showing the step of forming a stagger-type TFT of the first embodiment of the present invention and FIG. 8H is a top view showing the stagger-type TFT and its periphery.

First, as shown in FIG. 8A, a chromium film (hereafter referred to as a Cr film) 32 is formed on a transparent substrate 31 made of glass, quartz, or the like at the thickness of approx. 600 Å and then the Cr film 32 is patterned through lithography to form a light-shielding film 32 made of chromium. The light-shielding film 32 shields the backlight for driving a liquid crystal display so that it does not hit a channel region layer of an active semiconductor layer to be mentioned later.

Figure 11:
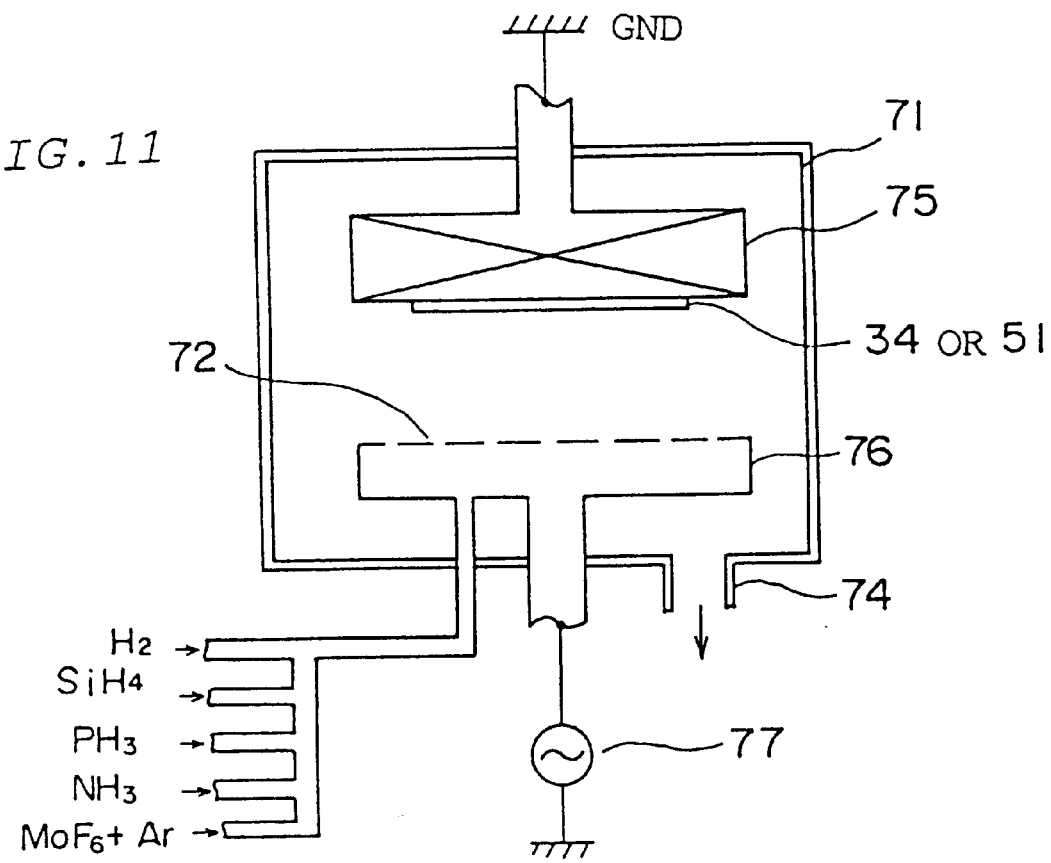
FIG. 11 is a block diagram of a film forming system used for each embodiment of the present invention.

Then, the transparent substrate 31 is set to the wafer holder 75 of the film forming system shown in FIG. 11 and thereafter a mixed gas of $SiH_4$ and $NH_3$ is introduced into the chamber 71 through the gas introduction port 72. Thus, an insulating film 33 made of silicon nitride for covering the light-shielding film 32 is formed on the transparent substrate 31 up to the thickness of 5,000 Å. Then, the transparent substrate 31 is taken out of the chamber 71. Then, an indium-tin oxide film (hereafter referred to as an ITO film) is formed on the insulating film 33 up to the thickness of approx. 500 Å through sputtering.

Figure 8B:
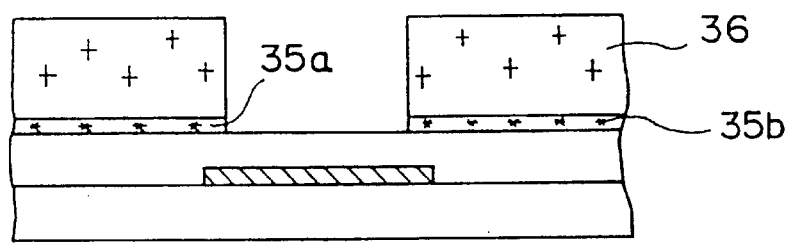

Thereafter, as shown in FIG. 8B, a resist pattern 36 to be divided above the light-shielding film 32 is formed in order to form a source electrode, drain electrode, and picture-element electrode. Then, the ITO film 35 is selectively etched by using the resist pattern 36 as a mask. This etching is wet etching using, for example, a mixed solution of Hcl and $NHO_3$.

Thus, a source electrode 35a and drain electrode 35b made of the ITO film 35 are formed and the ITO film 35 in a not-illustrated picture element region serves a picture element electrode.

Then, the transparent substrate 31 is set to the wafer holder 75 of the film forming system shown in FIG. 11 and the transparent substrate 31 is heated by a heater stored in the wafer holder 75 to keep the substrate at the temperature of, for example, 350° C.

Then, a mixed gas of $MoF_6$ and Ar is introduced into the chamber 71 from the gas introduction port 72 to keep the internal pressure of the chamber at 0.1 Torr. In this case, active species containing thermally-decomposed molybdenum (Mo) are adsorbed to the surface of the ITO film 35 with a large conductivity due to movement of electrons. For the insulating film 33 not covered with the ITO film 35, however, electron movement does not occur on the surface because the film 33 is made of an insulating material, and therefore no molybdenum is adsorbed to the surface.

Figure 8C:
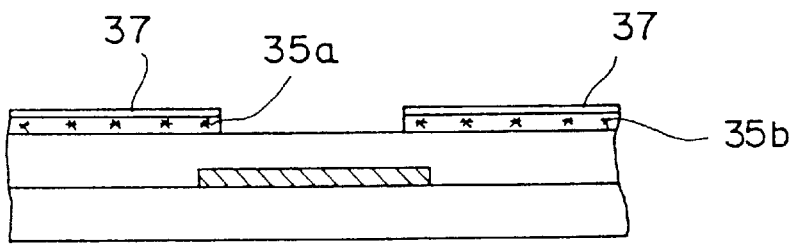

Thus, as shown in FIG. 8C, a very small amount of molybdenum 37 is selectively sticked only to the surfaces of the source electrode 35a and drain electrode 35b made of the ITO film 35.

To make selective sticking of molybdenum easy, it is also possible to slightly etch the surfaces of the source electrode 35a and drain electrode 35b by hydrogen plasma as the pretreatment for selective sticking of molybdenum. For the plasma treatment, the temperature of the transparent substrate 31 is set to 150° C., hydrogen gas is introduced into the chamber 71 to set the internal pressure to 0.1 Torr, and the power applied between the electrodes 75 and 76 is set to approx. 100 W. Though the temperature of the transparent substrate 31 is not restricted to 150° C., it is desirable to keep the temperature at 200° C. or lower in order to prevent the ITO film 35 constituting the electrodes from deteriorating. This is also described in the following literature.

A. J. Steckl and G. Mohammed: J. Appl. Phys., 51, 7, 3890 (1980)

After the molybdenum 37 is sticked, introduction of $MoF_6$ and Ar gases is stopped and the temperature of the transparent substrate 31 is set to 250° C. under a decompressed state.

Figure 12A:
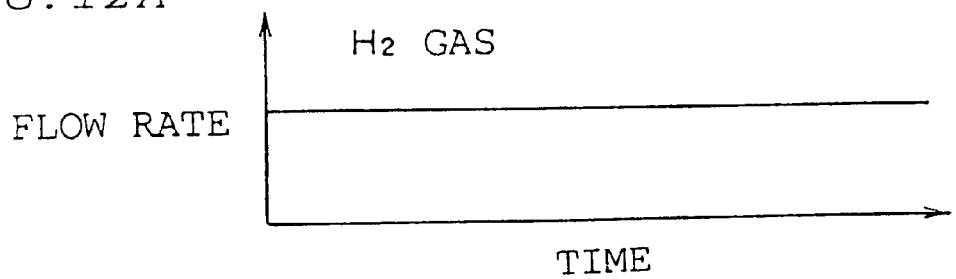
FIG. 12A is a hydrogen-gas flow rate diagram in forming a film of the TFT of each embodiment of the present invention and FIG. 12B is an other-gas flow rate diagram in forming a film of the TFT of each embodiment of the present invention.
Figure 12B:
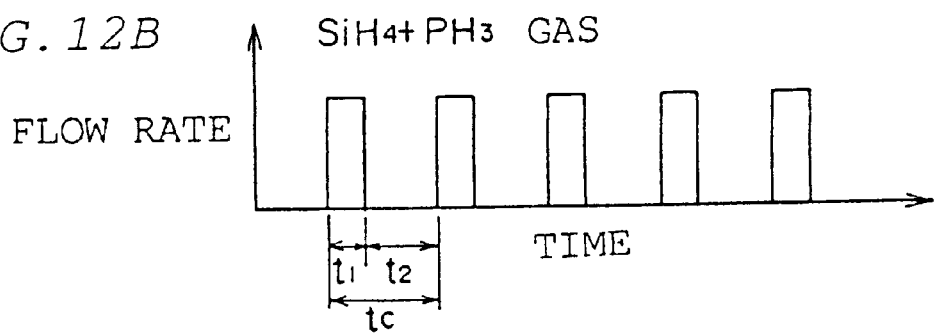

Then, as shown in FIG. 12A, hydrogen gas is steadily introduced into the chamber 71 from the first gas introduction port 72 at a certain flow rate. Moreover, as shown in FIG. 12B, a mixed gas of $SiH_4$ and $PH_3$ is introduced in the first time $t_1$ and introduction of the mixed gas of them is stopped in the next second time $t_2$. Then, the mixed gas is intermittently introduced into the chamber 71 by assuming the sum of these times "$t_1+t_2$" as one cycle "$t_c$". For example, the first time $t_1$ is set to 5 sec and the second time $t_2$ is set to 40 sec.

Then, the pressure in the chamber 71 is set to 0.3 Torr and the radio-frequency power to be applied between the wafer holder 75 and electrode 76 is set to 60 W to start plasma CVD. Thus, the $n^+$-type amorphous silicon film 38 ($n^+$-type a-Si) doped with phosphorus is deposited.

In this case, the $n^+$-type a-Si film 38 is smoothly formed on the source electrode 35a and drain electrode 35b made of the ITO film 35 by using the molybdenum 37 as growth species. However, because the growth species are almost absent on the insulating film 33 in the mixed-gas introduction time $t_1$, the $n^+$-type a-Si film is hardly formed. Even if the growth species are present a little on the insulating film 33 and a-Si is slightly formed on the film, the a-Si is etched by hydrogen plasma in the mixed-gas stop time $t_2$.

Figure 8D:
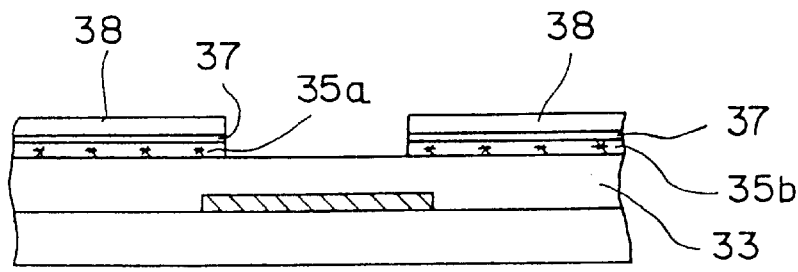

Thus, as shown in FIG. 8D, the $n^+$-type a-Si film 38 is selectively deposited on the source electrode 35a and drain electrode 35b made of ITO. This state is kept for a predetermined time to form the $n^+$-type a-Si film 38 up to the thickness of approx. 350 Å. Selective deposition of the a-Si film 38 is further explained for an embodiment to be mentioned later.

Figure 8E:
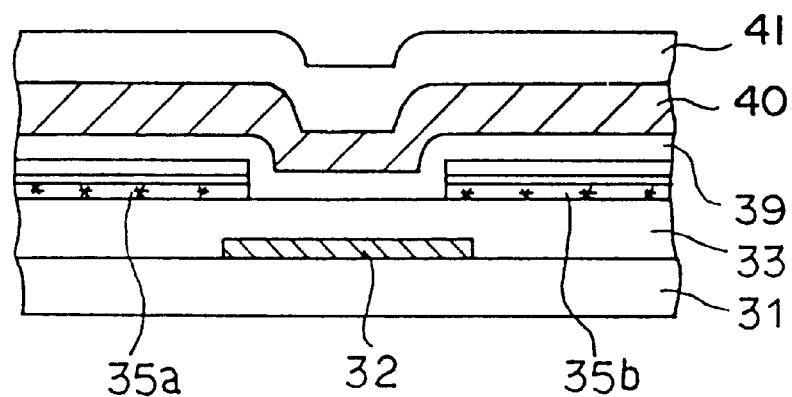

The following is the description of the step of forming a film shown in FIG. 8E.

First, the $n^+$-type a-Si film 38 is formed and thereafter introduction of $H_2$ and $PH_3$ gases is stopped while maintaining the low pressure of the chamber 71 and keeping the temperature of the transparent substrate 31 at 250° C. and $SiH_4$ gas is steadily introduced into the chamber 71 from the gas introduction port 72 to adjust the chamber pressure to 0.7 Torr. Then, the electrode applied power is set to 30 W to form an a-Si film 39 serving as an active semiconductor layer up to the thickness of approx. 350 Å by the plasma CVD.

Then, the substrate temperature is set to 200° C. and $SiH_4$ and $NH_3$ gases are introduced into the chamber 71 to adjust the pressure to 1 Torr. Then, the electrode applied power is set to 100 W to deposit a silicon nitride film 40 serving as a gate insulating film on the a-Si film 39 up to the thickness of approx. 3,000 Å by the plasma CVD.

Thereafter, the transparent substrate 31 is taken out of the chamber 71 and transferred to a not-illustrated sputtering system to form an Al film 41 serving as a gate electrode on the silicon nitride film 40 which is the top layer up to the thickness of approx. 3,000 Å.

Figure 8F:
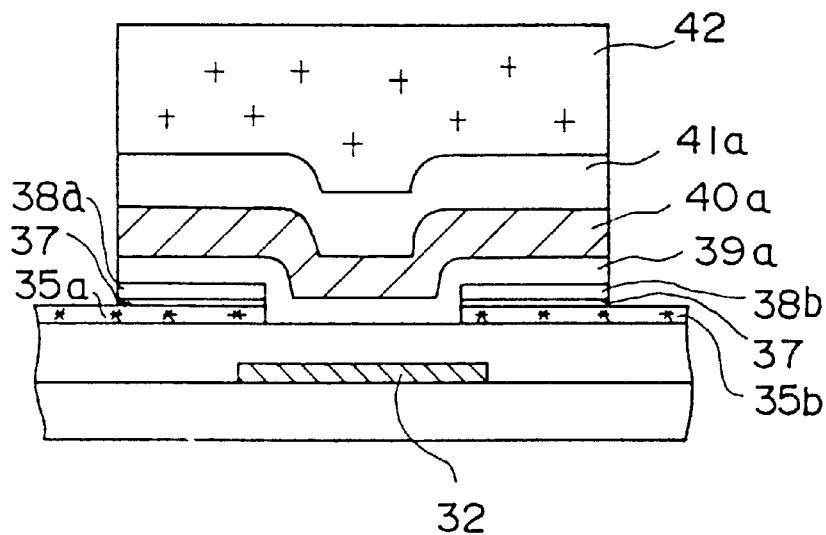

Then, the transparent substrate 31 is taken out of the sputtering system and thereafter resist 42 is applied onto the Al film 41 to form patterns for a gate electrode and gate bus line by exposing and developing the resist 42. The gate electrode pattern is shaped so as to partially cover the source electrode 35a and drain electrode 35b. Then, as shown in FIG. 8F, the Al film 41, silicon nitride film 40, a-Si film 39, $n^+$-type a-Si film 38, and molybdenum 37 in the region which is not covered with the pattern of the resist 42 are removed by etching them.

Thus, a gate electrode 41a made of the Al film 41, a gate insulating film 40a made of the silicon nitride film 40, an active semiconductor layer 39a made of the a-Si film 39, and contact layers 38a and 38b made of the $n^+$-type a-Si film 38 are formed. The region between the source electrode 35a and drain electrode 35b of the active semiconductor layer 39a serves as a channel region. Thus, the stagger-type TFT is completed.

Figure 8G:
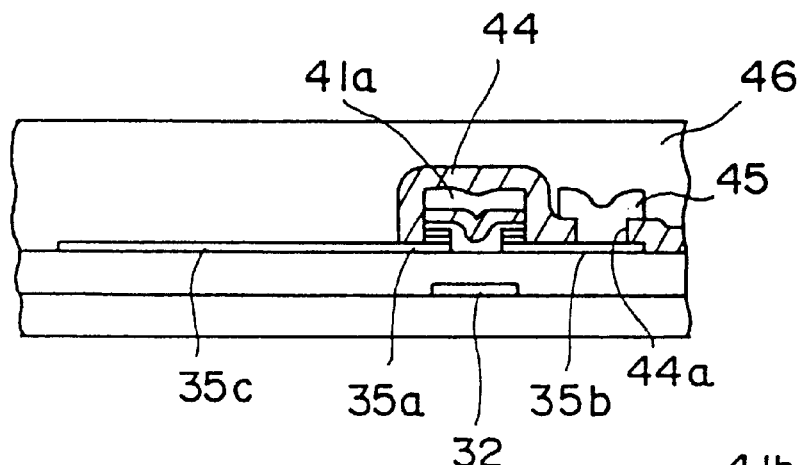
Figure 8H:
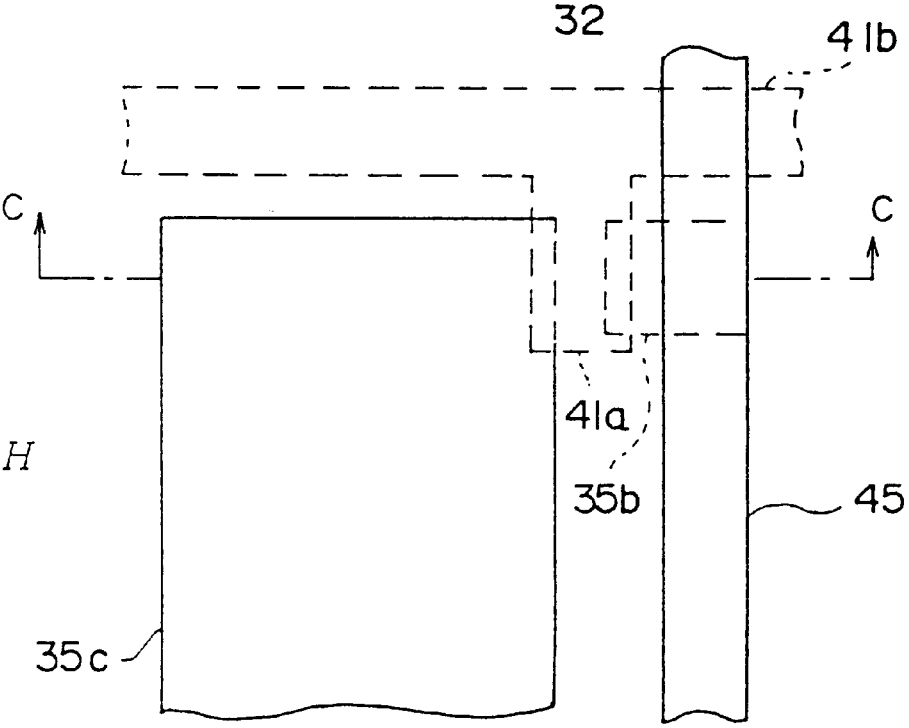

Then, as shown in FIGS. 8G and 8H, the TFT is covered with a silicon nitride film 44 and an opening section 44a is formed on the silicon nitride film 44 on the drain electrode 35b. Then, a drain bus line 45 to be connected to the drain electrode 35b is formed through the opening section 44a, and thereafter a liquid crystal layer 46 is laminated, and moreover a transparent electrode (not illustrated) and a second transparent substrate (not illustrated) are placed on the layer 46. Thus, a display section of an active-matrix-drive liquid crystal display device comprising the stagger-type TFT is completed.

In the above TFT fabrication step, molybdenum is selectively sticked onto the source electrode 35 and drain electrode 35b made of ITO, the $n^+$-type a-Si film 38 is selectively deposited by using the molybdenum as growth species, and the film 38 is used as the contact layers 38a and 38b. When selectively depositing the $n^+$-type a-Si film 38 without sticking molybdenum, the initial deposition of the film is hardly progressed and the throughput is decreased.

Moreover, in the above fabrication step, the steps from selective sticking of molybdenum onto the surfaces of the source electrode 35a and drain electrode 35b to formation of the gate insulating film 40 are continuously formed by using the same film forming system. Therefore, the $n^+$-type a-Si film 38 serving as a contact layer perfectly contacts the a-Si film 39 serving as an active semiconductor layer because the interface between the both films is not contaminated.

Moreover, because the $n^+$-type a-Si film 38 serving as the contact layers 38a and 38b is selectively deposited on the source electrode 35a and drain electrode 35b, the planar shape of the contact layers 38a and 38b becomes same as that of the source electrode 35a and drain electrode 35b. Therefore, the active semiconductor layer 39a is not thinned or abnormally deposited at the edges of the contact layers 38a and 38b.

The above-mentioned molybdenum is slightly sticked onto the ITO film 35. However, it is possible to selectively deposit the molybdenum as a film with the thickness of several hundreds of Å to several Å. It is also possible to selectively deposit the $n^++$-type a-Si film 38 on a molybdenum film.

Though this embodiment uses molybdenum obtained from $MoF_6$ gas as a core material for selectively depositing the $n^+$-type a-Si film, it is also possible to use a conductive metal such as tungsten obtained from $WF_6$ gas, aluminum obtained from $Al(CH)_3$ gas, Ti obtained from $TiCl_4$ gas, or Ta obtained from $TaCl_5$ gas. Moreover, it is possible to use a refractory metal such as molybdenum silicide or tungsten silicide. The same effect can be also obtained by slightly depositing any one of these materials, distributing it like an island, or forming it into a film.

Though the above-mentioned fabrication step uses a method (thermal chemical vapor deposition) for thermally activating a gas containing a conductive material and depositing the conductive material on the ITO film 35 (source electrode 35a and drain electrode 35b), it is also possible to use the plasma chemical vapor deposition for electrically activating and depositing the gas containing the conductive material.

To selectively form the $n^+$-type a-Si film 38 serving as a contact layer, it is not necessary to steadily introduce hydrogen gas. Therefore, it is possible to introduce the hydrogen gas only for the time $t_2$ in which a mixed gas of $SiH_4$ and $PH_3$ stops.

This is because hydrogen gas is transformed into plasma and introduced to remove silicon from the surface of the insulating film 33.

The following is a method for efficiently remove silicon from the surface of the insulating film 33. That is, in the time $t_2$ in which the mixed gas of $SiH_4$ and $PH_3$ stops, it is possible to improve the capacity for etching a-Si slightly formed on the insulating film 33 by switching the connections between the power supply 77 and earth GND, connecting the power supply 77 to the wafer holder 75, and connecting the earth GND to the electrode 76. Thus, the selectivity for deposition of the a-Si film 38 on the ITO film 35 can be improved.

Besides $H_2$, Ne, Ar, Kr, or Xe may be used as etching gas.

(2) Second Embodiment

The step of fabricating a inverted-stagger-type TFT is described below by referring to FIGS. 9A to 9C.

Figure 9A:
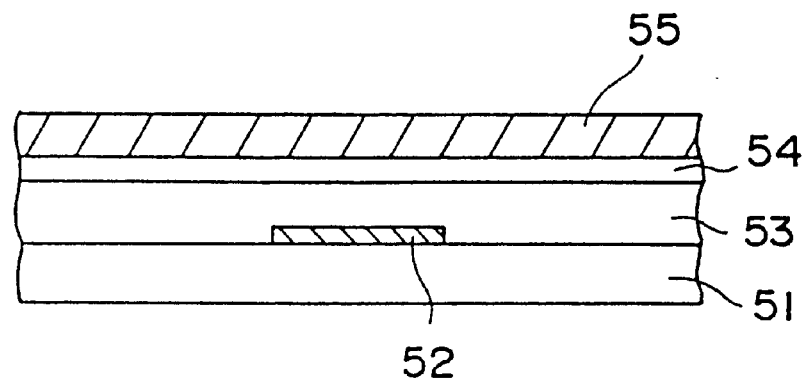
FIGS. 9A to 9F are sectional views showing the step of forming a inverted-stagger-type TFT of the second embodiment of the present invention and FIG. 9G is a top view showing the inverted-stagger-type TFT and its periphery.

First, as shown in FIG. 9A, a gate electrode 52 made of a titanium (Ti) film with the thickness of approx. 800 Å and a gate bus line (not illustrated) are formed on a transparent substrate 51 made of glass or quartz and thereafter a gate insulating film 53 made of a silicon nitride film with the thickness of approx. 3,000 Å. Moreover, an a-Si film 54 and an insulating film 55 made of silicon oxide are continuously formed up to the thicknesses of 300 Å and 1,500 Å respectively through the CVD.

Figure 9B:
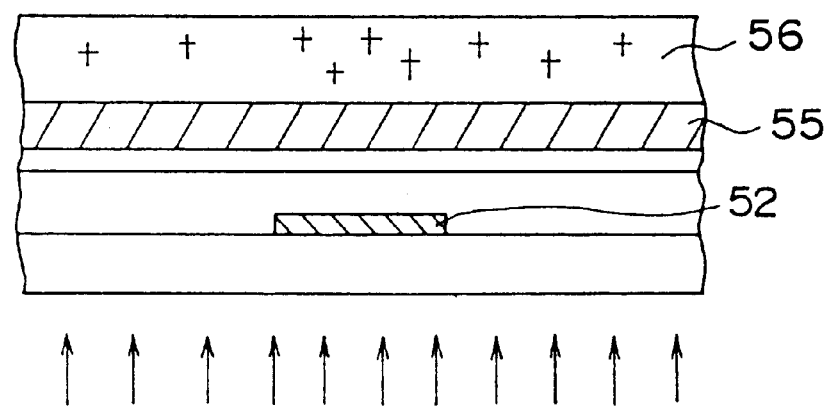

Then, as shown in FIG. 9B, resist 56 is applied onto the insulating film 55 and thereafter the resist 56 is selectively exposed by using the gate electrode 52 as a mask and applying light from the back of the transparent substrate 51.

Figure 9C:
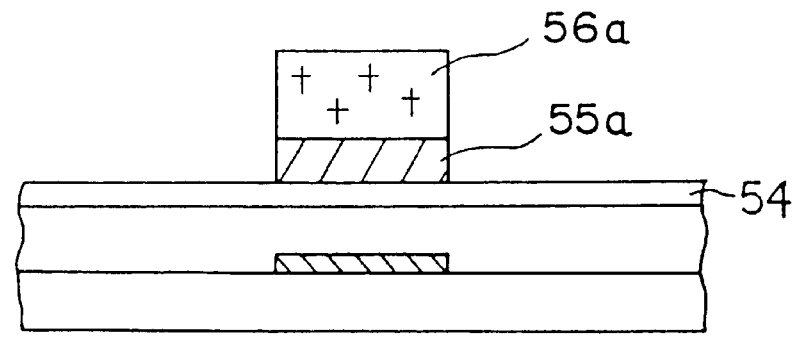

Then, as shown in FIG. 9C, the resist 56 is developed to selectively form a resist pattern 56a and thereafter the insulating film 55 not covered with the resist pattern 56a is etched. Thus, a channel protective coat 55a is formed on the gate electrode 52.

Figure 9D:
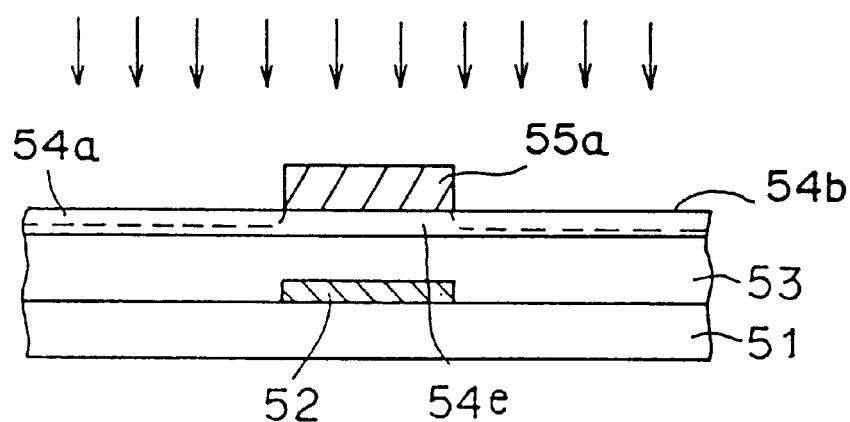

Then, as shown in FIG. 9D, the resist pattern 56a on the channel protective coat 55a is removed and thereafter phosphorus is introduced to the a-Si film 54 at the both sides of the film 55a through ion implantation by using the channel protective coat 55a as a mask. As the ion implantation conditions, the dose rate is set to $5 \times 1015/cm^2$ and the acceleration voltage is set to 30 KeV.

Thereafter, at least the upper portion of the a-Si film 54 at the both sides of the channel protective coat 55a is transformed into the $n^+$ type by activating impurities through annealing at the temperature of approx. 250° C. The a-Si film 54 transformed into the $n^+$ type serves as the contact layers 54c and 54d.

The a-Si film 54 in the region between the contact layers 54c and 54d, that is, in the region under the channel protective coat 55a serves as an active semiconductor layer 54e.

Thereafter, hydrogen gas is introduced into the chamber 71 by using the film forming system shown in FIG. 11. Then, the hydrogen is transformed into plasma by setting the pressure in the chamber 71 to 0.1 Torr and applying the radio-frequency power of 300 W to the electrode 76 and the surfaces of the $n^+$-type contact layers 54c and 54d and the channel protective coat 55a are cleaned for 5 min by the hydrogen plasma.

The description of the cleaning method of the $n^+$-type contact layers 54c and 54d is supplemented in FIGS. 15A to 16C.

Then, the transparent substrate 51 is heated by a heater stored in the wafer holder 75 to keep the temperature at 250° C. Then, a mixed gas of $MoF_6$ and Ar is introduced into the chamber 71 to keep the pressure at 0.1 Torr. In this case, active species containing thermally-decomposed molybdenum (Mo) are adsorbed onto the $n^+$-type contact layers 54c and 54d with a large conductivity due to movement of electrons on the layers. However, the active species are not adsorbed onto the channel protective coat 55a because the film 56a is made of an insulating material and therefore no electron movement occurs on the film 55a.

Figure 9E:
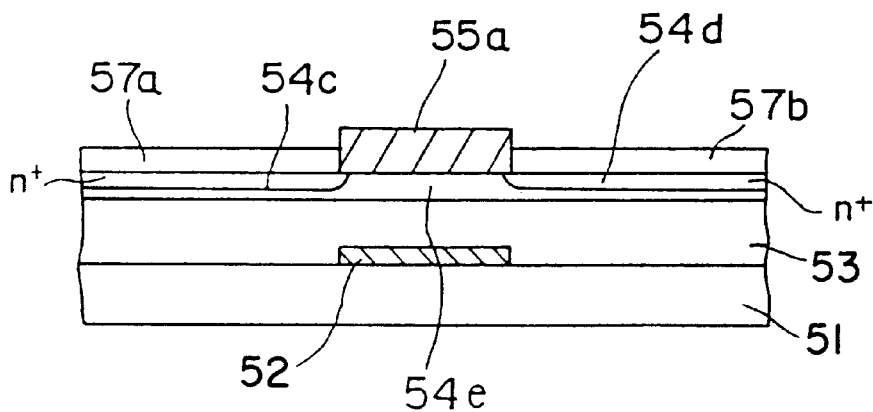

Thus, as shown in FIG. 9E, Mo films 57a and 57b with the thickness of approx. 1,000 Å are formed in self-alignment by depositing molybdenum on the contact layers 54c and 54d at the both sides of the channel protective coat 55a.

Thereafter, the transparent substrate 51 is taken out of the chamber 71 and then the Mo films 57a and 57b and the a-Si film 54 (contact layers 54c and 54d) are patterned through lithography using a resist mask to remove these films from regions other than the TFT region. Thus, a source electrode 57a made of a Mo film 57c and a drain electrode 57d made of a Mo film 57d are formed. The lithography uses the dry etching method using $CCl_4$ gas.

Thus, the inverted-stagger-type TFT is completed.

Figure 9F:
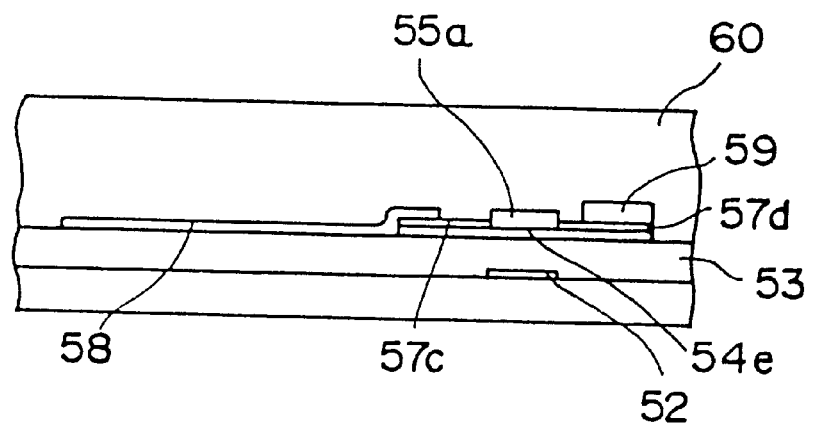
Figure 9G:
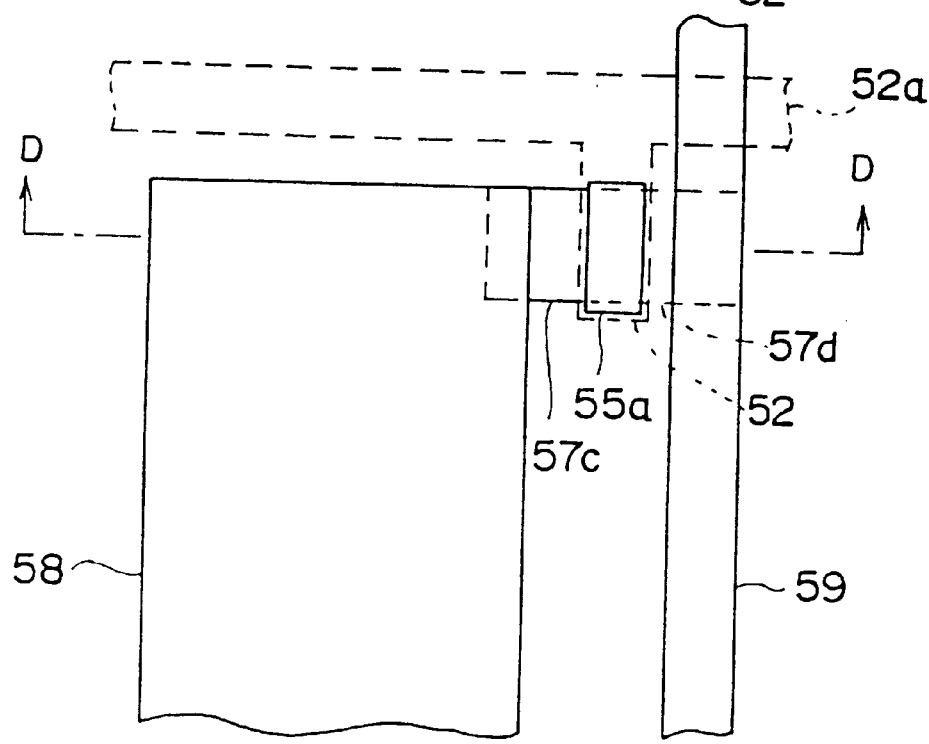

Hereafter, as shown in FIGS. 9F and 9G, a picture-element electrode 58 to be connected to the source electrode 57c is formed and moreover a drain bus line 59 to be connected to the drain electrode 57d is formed.

Then, a liquid crystal layer 60 is formed and a transparent electrode and transparent substrate which are not illustrated are formed on the layer 60.

As described above, this embodiment forms the Mo films 57a and 57b on the a-Si film 54 exposed at the both sides of the channel protective coat 55a selectively and in self-alignment and uses the films 57a and 57b as the source electrode 57c and drain electrode 57d respectively.

Therefore, the source electrode 57c and drain electrode 57d are not overlapped with the channel protective coat 55a, the gate length and gate width are actually decreased, and the parasitic capacity decreases. Moreover, because the lift-off method is not used, contaminant such as resist does not remain on the surface of the transparent substrate 51 or channel protective coat 55a.

For this embodiment, the Mo films 57a and 57b are selectively formed on the a-Si film 54 through the thermal CVD using the mixed gas of $MoF_6$ and Ar. However, it is also possible to selectively deposit a conductive film through the thermal CVD using the following gas.

For example, the conductive film includes such metallic films as a tungsten (W) film formed by using $WF_6$ gas and $H_2$ gas, a titanium (Ti) film formed by using $TiCl_4$ gas and $H_2$ gas, and an aluminum (Al) film formed by using $Al(CH_3)_3$ gas and $H_2$ gas, and also includes such refractory metal silicide films as a molybdenum silicide film formed by using $MoCl_5$ gas and $SiH_4$ gas, a tungsten silicide film formed by using $WF_6$ gas and $SiH_4$ gas, and a titanium silicide film formed by using $TiCl_4$ gas and $SiH_4$ gas.

To increase the speed for forming a metallic film or refractory metal silicide film serving as a source electrode and drain electrode, it is possible to use the plasma CVD instead of the thermal CVD.

(3) Third Embodiment

The following is the description of another step of fabricating the inverted-stagger-type TFT.

First, the gate electrode 52 and a gate bus line (not illustrated) are formed on the transparent substrate 51 made of glass or quartz and thereafter the gate insulating film 53, a-Si film 54, and insulating film 55 made of silicon oxide are laminated on them in order by the same step as the second embodiment.

Figure 10A:
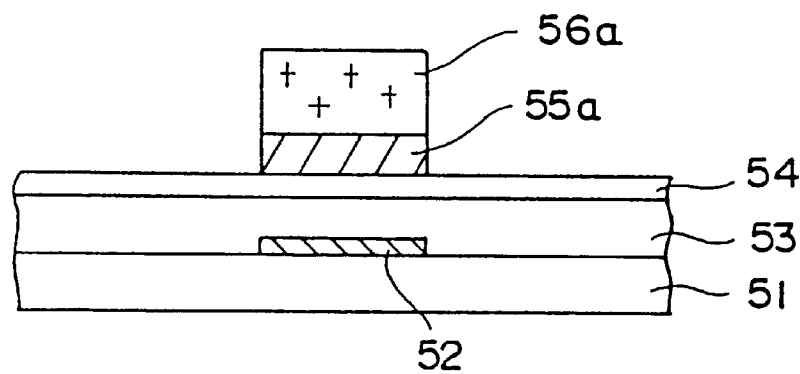
FIGS. 10A to 10C are sectional views showing the step of forming a inverted-stagger-type TFT of the third embodiment of the present invention.
Figure 10B:
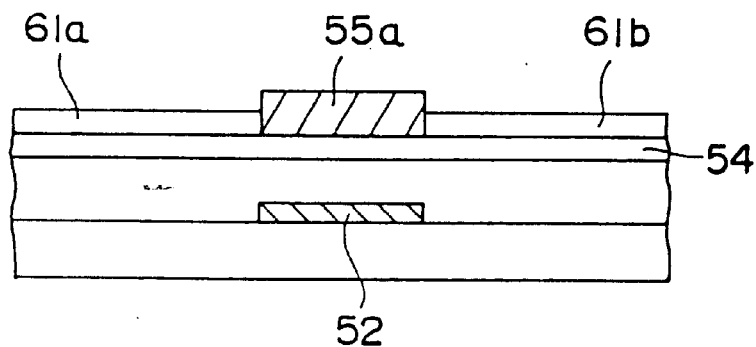

Then, similarly to the case of the second embodiment, the insulating film 55 is patterned by using the resist pattern 56a to form the channel protective coat 55a on the gate electrode 52. FIG. 10B shows the cross section of the above state.

After the resist pattern 56a is removed, $n^+$-type amorphous silicon films ($n^+$-type a-Si films) 61a and 61b doped with phosphorus are selectively deposited on the a-Si film 54.

The selective deposition method is shown below.

First, the transparent substrate 51 is introduced into the chamber 71 by using the film forming system shown in FIG. 11 and secured to the wafer holder 75, and the chamber 71 is decompressed to heat the transparent substrate 51 up to 250° C.

Then, $H_2$ gas is steadily introduced into the chamber 71 while applying light with the wavelength of 800 nm or less to the a-Si film 54 as shown in FIG. 12A. At the same time, the mixed gas of $SiH_4$ and $PH_3$ is introduced into the chamber 71 in the introduction time $t_1$ and the introduction of the mixed gas is stopped in the stop time $t_2$. This operation is cyclically repeated. For example, the introduction time $t_1$ is set to 20 sec and the stop time $t_2$ is set to 40 sec. In this case, the pressure in the chamber 71 is set to 0.3 Torr.

Under the above state, the radio-frequency power of 60 W is applied between the wafer holder 75 and electrode 76 to transform the mixed gas into plasma. Then, formation of the $n^+$-type a-Si films 61a and 61b is started. In this case, the surface of the a-Si film 54 is activated because of irradiation of light. Therefore, the $n^+$-type a-Si films 61a and 61b are smoothly deposited on the a-Si film 54 in the introduction time $t_1$. However, because no conductive carrier is produced on the channel protective coat 55a, an a-Si film is hardly deposited on the channel protective coat 55a.

Even if $n^+$-type a-Si is slightly formed on the channel protective coat 55a, the $n^+$-type a-Si is etched by hydrogen plasma in the stop time $t_2$. Therefore, only the $n^+$-type a-Si films 61a and 61b are selectively formed on the a-Si film 54. By repeating the cycle of deposition and etching, the $n^+$-type a-Si films 61a and 61b become contact layers.

After the contact layers are formed, the mixed gas of $MoF_6$ and Ar is introduced into the chamber 71 and the atmospheric pressure is set to 0.1 Torr while keeping the chamber 71 decompressed and the temperature of the transparent substrate 51 at 250° C.

Figure 10C:
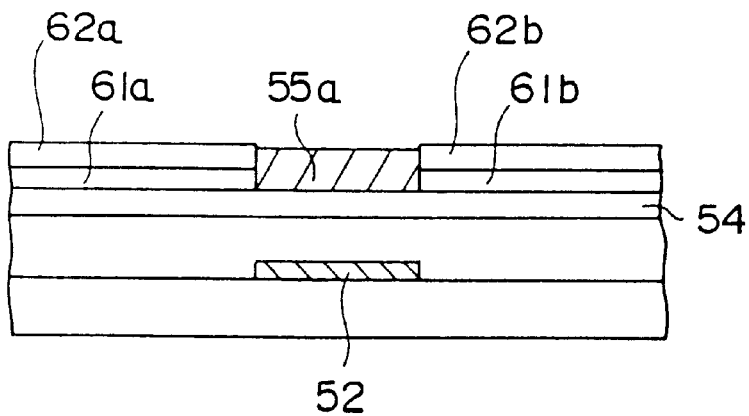

In this case, active species containing thermally-decomposed Mo are adsorbed onto the $n^+$-type a-Si films 61a and 61b due to movement of electrons because the film surfaces have a large conductivity. However, because the channel protective coat 55a is made of an insulating material, electron movement does not occur in the film and therefore the active species are not adsorbed onto the film. Thus, as shown in FIG. 10C, Mo films 62a and 62b are formed only on the n$^+$-type a-Si films (contact layers) 61a and 61b at the both sides of the channel protective coat 55a in self-alignment and selectively. The Mo films 62a and 62b are deposited up to the thickness of approx. 1,000 Å.

Thereafter, the Mo films 62a and 62b, n$^+$-type a-Si films 61a and 61b, and a-Si film 54 are patterned by the lithography same as the second embodiment to form a source electrode 63a and a drain electrode 63b made of the Mo films 62a and 62b respectively and transform the a-Si film 54 into an active semiconductor layer. The source electrode 63a and drain electrode 63b are the active semiconductor layer (54) through the n$^+$-type a-Si films 61a and 61b serving as contact layers.

Thus, the inverted-stagger type TFT is completed and then the step of forming a picture-element electrode and drain bus line is described below. However, steps after the above step are omitted because they are the same as those of the second embodiment.

As described above, the step of fabricating the inverted-stagger-type TFT of the third embodiment of the present invention laminates the n$^+$-type a-Si films 61a and 61b and the Mo films 62a and 62 on the a-Si film 54 exposed at the both sides of the channel protective coat 55a selectively and in self-alignment. Therefore, the source electrode 63a and drain electrode 63b are not overlapped with the channel protective coat 55a. Thus, similarly to the case of the second embodiment, the parasitic capacity decreases and the transparent substrate 51 is not contaminated in patterning.

Moreover, for the second embodiment, ion implantation is performed to improve the conductivity of the a-Si film 54 in forming the n-type a-Si films 61a and 61b. However, this embodiment simplifies the step compared with the second embodiment because only light is applied.

(4) Fourth Embodiment

For the above embodiments, the entire TFT fabrication step is described. For the subsequent embodiments, however, selective deposition of an amorphous semiconductor layer serving as a contact layer and cleaning before the selective deposition are mainly described.

First, the above-mentioned selective deposition of an a-Si film performed by repetition of the cycle of deposition and etching is described below by referring to FIGS. 13A to 13C and FIGS. 14A to 14F.

Figure 13A:
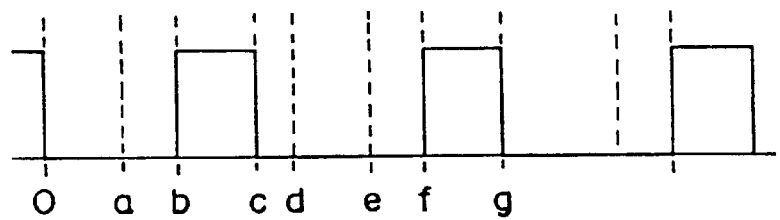
FIGS. 13A to 13C are time charts for explaining the selective deposition of a-Si of each embodiment of the present invention.
Figure 13B:
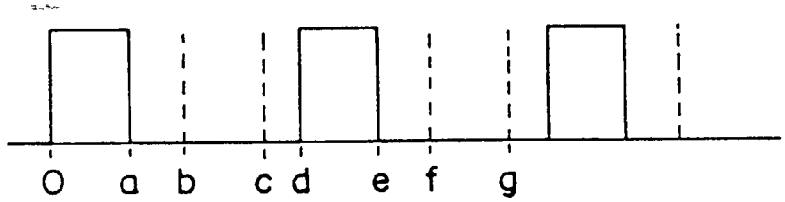
Figure 13C:
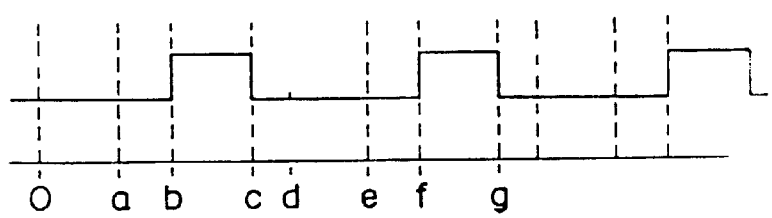

FIG. 13A is a chart for controlling the flow rate of hydrogen gas to be supplied to a film forming system used for TFT fabrication, FIG. 13B is a chart for controlling the flow rate of silane gas for a-Si deposition, and FIG. 13C is a chart for controlling radio-frequency power (hereafter referred to as RF output). In FIGS. 13A to 13C, the axis of ordinates shows control quantity and the axis of abscissas shows time base. On the time base of the RF output control chart in FIG. 13C, 0 and a, b, . . . , and g shown control time points, and time range b–c and f–g show states in which the RF output quantity is increased.

To etch silicon or the like with hydrogen plasma by using the film forming system shown in FIG. 11, there are a method for setting the pressure in the chamber 71 for etching to a value lower than that for film forming and a method for setting the plasma excitation energy for etching to a value larger than that for film forming as the means for accelerating the treatment. Moreover, there are a method for setting the potential to be applied to a substrate for etching to a value lower than that for film forming and a method for setting the frequency of the excitation voltage of a radio-frequency power supply 77 for etching to a value different from that for film forming. Furthermore, there are a method for setting the magnetic flux density for confining plasma by a magnetic field for etching to a value higher than that for film forming and a method for setting the acceleration voltage of the remote plasma for etching to a value higher than that for film forming.

These methods are described below by referring to drawings.

Figure 14A:
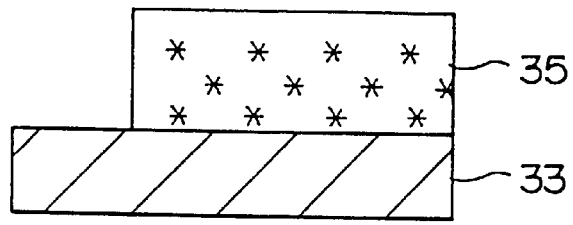
FIGS. 14A to 14F are sectional views for supplementing the explanation of the a-Si film forming step of each embodiment of the present invention.
Figure 14B:
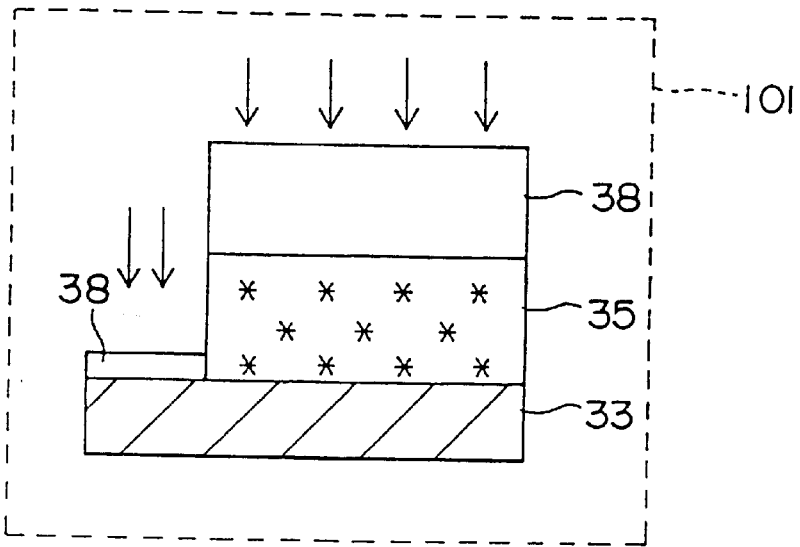

For example, as shown in FIG. 14A, when a-Si is selectively deposited only on the ITO film 35 patterned on the insulating film 33 made, of glass or silicon nitride, a substrate having the insulating film 33 is set to the wafer holder 75 shown in FIG. 11. The insulating film 33 can be a glass substrate or a silicon nitride film laminated on the substrate. Therefore, the material is not restricted. Moreover, the temperature of the insulating film 33 is assumed as the substrate temperature.

In this case, silane (SiH$_4$) gas is intermittently supplied through the gas introduction port 72 of the film forming system and an RF power is applied between the wafer holder 75 and electrode 76 to produce plasma.

Concretely, for the control time 0–a in the silane-gas flow rate control chart shown in FIG. 13B, the silane gas is supplied at the flow rate of 5 sccm to adjust the pressure in the chamber 71 to 0.3 Torr. For the control time 0–a in the RF output control chart shown in FIG. 13C, the RF power is set to 200 W and the substrate temperature is set to 250° C. In this step, it is possible to dilute the silane gas by simultaneously supplying hydrogen at the flow rate of 15 sccm.

Thus, SiH$_4$ is decomposed by the produced plasma atmosphere 101 and the a-Si film 38 is deposited on the insulating film 33 and ITO film 35. The a-Si film 38 is thickly deposited on the ITO film 35 but thinly deposited on the insulating film 33. This is because the a-Si species growth time on the surface of the ITO film 35 is longer than that on the surface of the insulating film 33. The species growth time is defined as the time until deposition of the a-Si film 38 starts after a reaction gas is supplied.

Supply of the silane gas is stopped at the time "a" and simultaneously deposition of the a-Si film 38 is stopped. Then, hydrogen gas is supplied through the gas introduction port 72, an RF power is applied between the wafer holder 75 and electrode 76 to produce a hydrogen plasma atmosphere 102 shown in FIG. 14C in the atmosphere between them and etch the a-Si film 38 on the insulating film 33 by the produced hydrogen plasma. It is also possible to use halogen-based fluorine, chlorine, iodine, or bromine, a compound of bromine, or mixed gas containing any one of them instead of the hydrogen.

Concretely, hydrogen gas is supplied at the flow rate of 100 sccm for the time range b–c in the hydrogen flow rate control chart in FIG. 13A to adjust the pressure in the chamber 71 to 0.3 Torr. Also for the control time b–c in the RF output control flow chart in FIG. 13C, the RF power is set to 300 W and the substrate temperature is set to 200° C. or lower. This is because the crystallization temperature of the ITO film 35 is 200° C. When etching is performed at 200° C. or higher, recrystallization of the ITO film 35 or change of the molecular bond state progresses and hydrogen or halogen chemically reacts on portions with a weak bond to destroy the structure of the ITO film 35. As a result, a bad influence may be produced that the resistivity of the ITO film 35 increases, the transparency of it decreases, or a film formed on the film 35 is abnormally deposited. For etching with hydrogen plasma, it is possible to add a compound of halogen-based fluorine and chlorine or a mixed gas containing the compound. For etching of a-Si, the range from 200° C. to the room temperature is preferable by considering deterioration of the ITO film 35 because the etching rate increases as the substrate temperature lowers as described in a later embodiment.

Figure 14C:
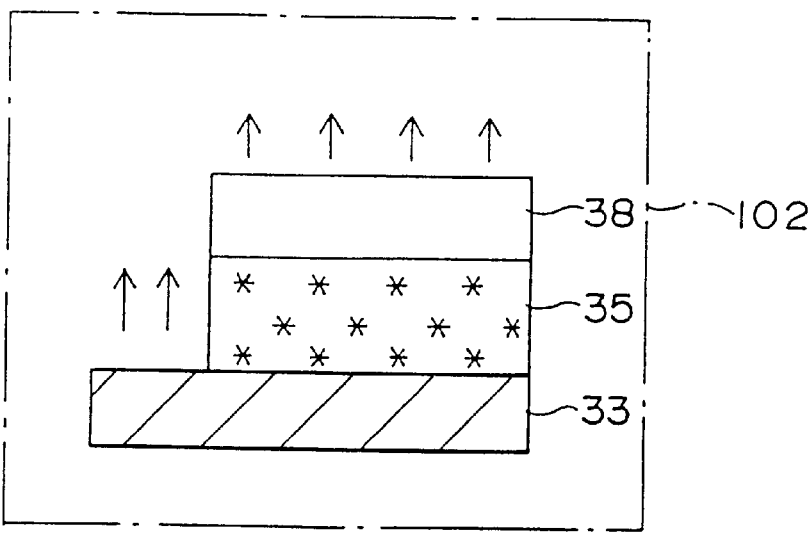

The hydrogen plasma etching completely removes the thin a-Si film 38 from the insulating film 33 as shown in FIG. 14C. At the same time, the a-Si film 38 thickly deposited on the ITO film 35 is etched by the above etching. However, the a-Si film 38 on the ITO film 35 is not completely removed because it is thicker than the a-Si film 38 on the insulating film 33, as shown in FIG. 14C.

Supply of hydrogen is stopped at the time "c" to stop etching. In this case, the RF output is decreased to 200 W. However, it is possible to continuously supply hydrogen at the flow rate of 15 sccm.

Then, for the control time d–e shown in FIG. 13B, silane gas is supplied into the chamber 71 at the flow rate of 5 sccm similarly to the a-Si deposition step shown by the control time 0–a to adjust the pressure in the chamber 71 to 0.3 Torr. For the RF output control time d–e shown in FIG. 13C, the RF power is set to 200 W and the substrate temperature is set to 250° C.

Figure 14D:
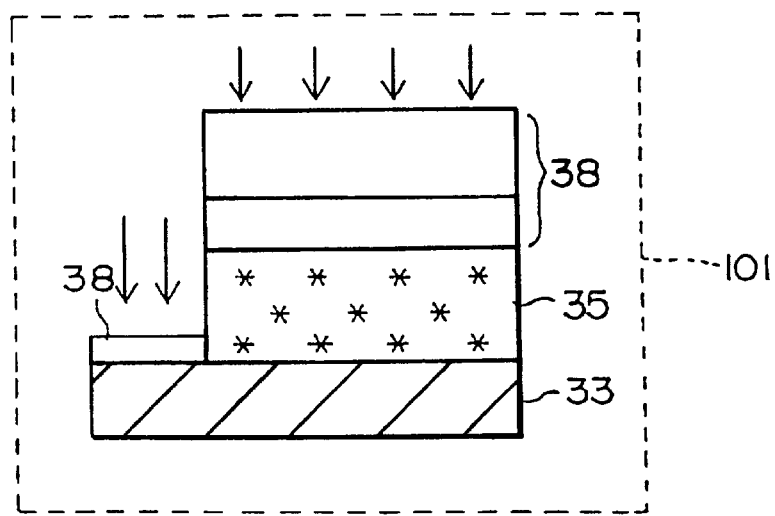

Thus, $SiH_4$ is decomposed by plasma and the a-Si film 38 is deposited on the insulating film 33 and ITO film 35, as shown in FIG. 14D.

Then, supply of silane gas is stopped at the time "e" to stop deposition of the a-Si film 38.

Figure 14E:
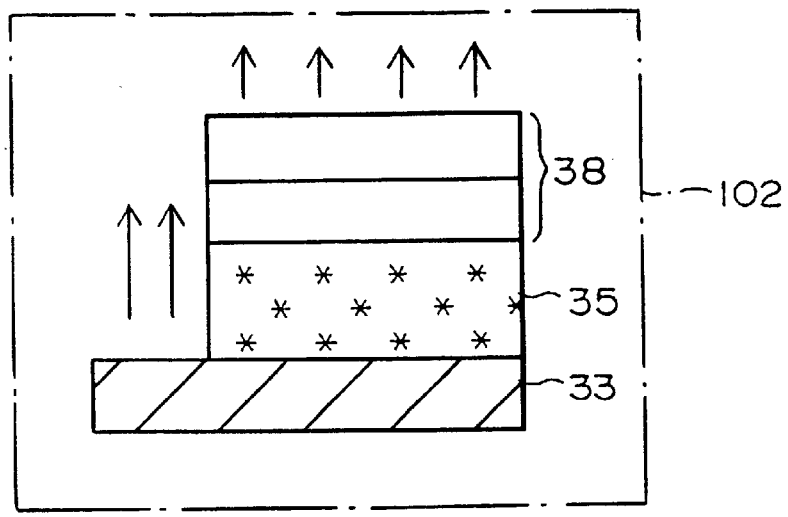

Thereafter, hydrogen gas is applied into the chamber 71 at the flow rate of 100 sccm for the control time f–g to set the pressure in the chamber 71 to 0.3 Torr. Also for the control time f–g, the RF output is set to 300 W and the substrate temperature is set to 200° C. or lower. Thus, the a-Si film 38 is removed from the insulating film 33, as shown in FIG. 14E.

Then, supply of hydrogen gas is stopped at the time "g" to stop etching and decrease the RF output to 200 W.

Figure 14F:
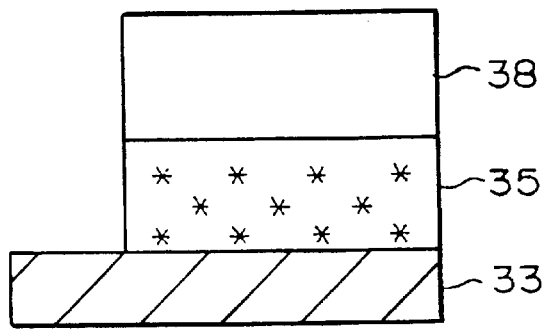

In the subsequent steps, the a-Si film 38 with a desired thickness is selectively deposited on the ITO film 35 shown in FIG. 14F by repeating the above-mentioned deposition and etching steps. The time range a–b, c–d, and e–f are set to replace the gas in the plasma generation chamber during deposition and etching.

For the above steps, the substrate temperature is set to 200° C. or lower so that an ITO film is hardly reduced by using hydrogen plasma for etching of a-Si by hydrogen plasma. Etching is accelerated by increasing the RF output for etching. Moreover, the hydrogen-molecule moving speed is increased and the etching rate are improved by setting the pressure in the chamber 71 for etching to a value smaller than that for deposition of the a-Si film 38. Moreover, the etching rate further increases by setting the temperature to 200° C. or lower.

Under the above conditions, because the energy for exciting the plasma atmosphere 102 for plasma etching is larger than that for exciting the plasma atmosphere 101 for deposition of the a-Si film 38, the plasma density is increased and the etching rate is increased. Moreover, because the substrate potential for etching the a-Si film 38 is lower than that for deposition of a-Si, the incoming ion energy increases and the etching rate increases by relatively setting the substrate potential to a negative value.

Moreover, as described above, the frequency of the excitation voltage of the radio-frequency power supply 77 for plasma etching is different from that for deposition of the a-Si film 38. For example, the plasma density can be increased by raising the frequency of the radio-frequency power supply 77 for etching and increasing the concentration of excitation species.

Furthermore, as described above, when setting the magnetic flux density for confining the plasma atmosphere 102 for plasma etching by a magnetic field to a value larger than that for confining the plasma atmosphere 101 for deposition of the a-Si film 38 by the magnetic field, plasma is compressed by the magnetic field and the plasma density increases.

Furthermore, as described above, when setting the acceleration voltage of the remote plasma for plasma etching to a value larger than that for deposition of the a-Si film 38, plasma is applied to a surface to be etched at a high energy to increase the etching rate.

Thus, the etching rate is increased by changing the plasma conditions in the time for etching the a-Si film 38 on the insulating film 33, selective deposition of a-Si is efficiently performed, and the productivity is improved. When setting the substrate temperature for etching as above mentioned, damage of the ITO film 35 serving as a picture-element electrode is greatly decreased, the transparency of the electrode is maintained, and the electrical resistance value is prevented from increasing.

As the result of selectively depositing an a-Si film under the following conditions, things like beard are produced on the a-Si film on an ITO film. The bear-like things are also produced when silicon is selectively deposited on $SnO_2$, NiO, or TiN.

The conditions are to set the substrate temperature to 300° C., the pressure to 0.6 Torr, the RF power to 200 W, and the hydrogen flow rate to 300 sccm for the etching control time, and also set the substrate temperature to 300° C., the pressure to 0.6 Torr, the RF power to 200 W, the silane flow rate to 160 sccm, and the for the deposition control time.

Figure 15B:
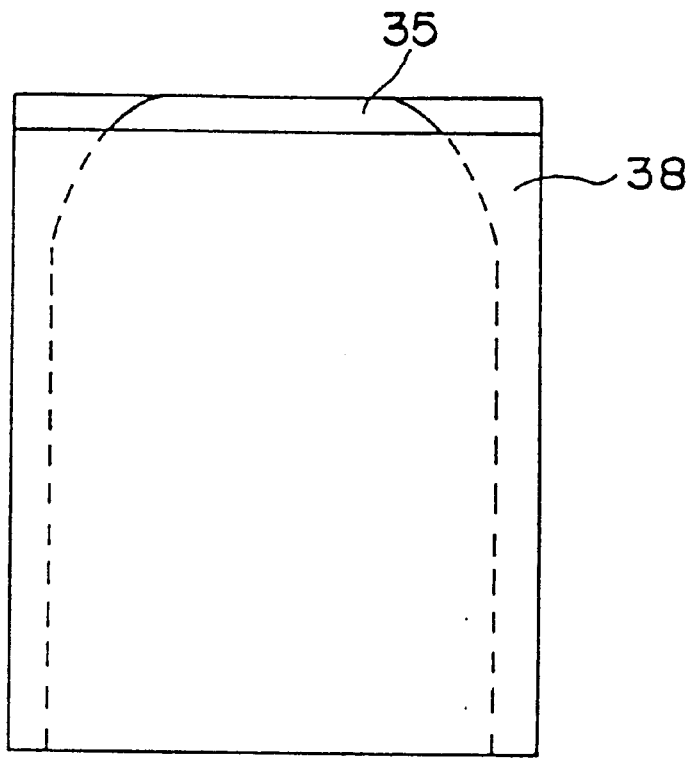
FIG. 15A is a top view for explaining abnormal deposition of an a-Si film on the ITO film of each embodiment of the present invention and FIG. 15B is a top view for explaining normal deposition of amorphous silicon.
Figure 15A:
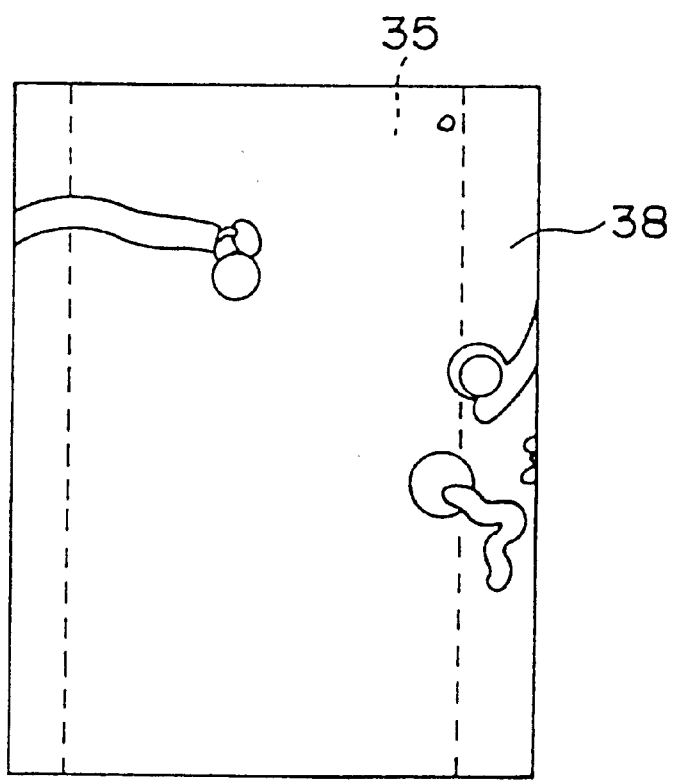

The things like beard are produced because the substrate temperature is set to 300° C. As the result of depositing the film at the substrate temperature of 200° C. or lower, things like beard are not produced as shown in FIG. 15B.

The substrate temperature not only causes such abnormal deposition on a-Si but influences the time necessary for selective deposition. For example, to obtain an adequate selectivity between an ITO film and glass substrate by setting the substrate temperature to 350° C., it is necessary to perform etching with hydrogen plasma for 42 sec and deposition of silicon with silane for 8 sec. Under this condition, it takes 1 hr and 40 min to deposit a silicon film with the thickness of 1,000 Å.

When setting the substrate temperature to 250° C., however, it is enough to perform etching with hydrogen plasma for 16 sec and deposition of the a-Si film 38 with $SiH_4$ for 8 sec and the time for depositing a silicon film with the thickness of 1,000 Å requires 48 min.

In the embodiments of the present invention, the case is described in which a-Si is selectively deposited on an ITO film. However, the present invention can be also applied to a case in which metal such as Mo or Ti or refractory silicide is deposited on an ITO film. Though the substrate temperature is made different in the film forming step and etching step, it is also possible to perform film forming and etching at the same temperature. Moreover, it is possible to use $SnO_2$, NiO, ZnO or TiN instead of the ITO film.

(5) Fifth Embodiment

Cleaning of film surface in the TFT fabrication step is described below by referring to FIGS. 16A to 16C. Also, cleaning of the surface of an a-Si film is described below by referring to FIGS. 17A to 17C.

Figure 16A:
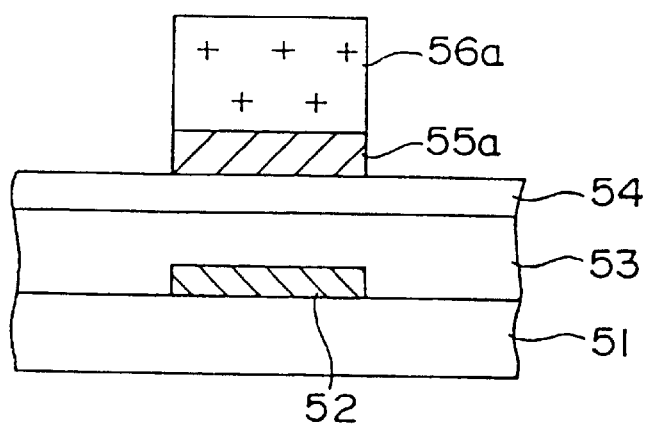
FIGS. 16A to 16C are sectional views showing the step of cleaning a-Si of each embodiment of the present invention and FIGS. 17A to 17D are sectional views for explaining the step of cleaning the a-Si constituting the stagger-type TFT of the first embodiment of the present invention.
Figure 16B:
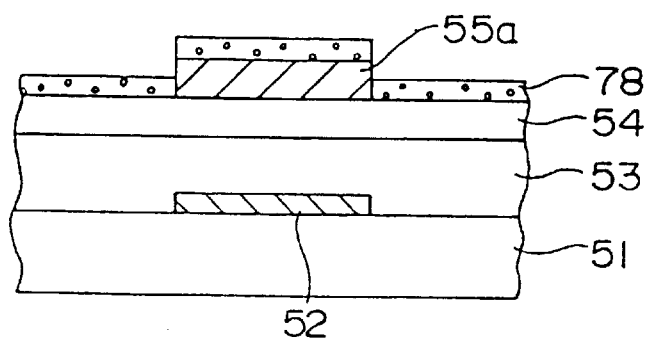
Figure 16C:
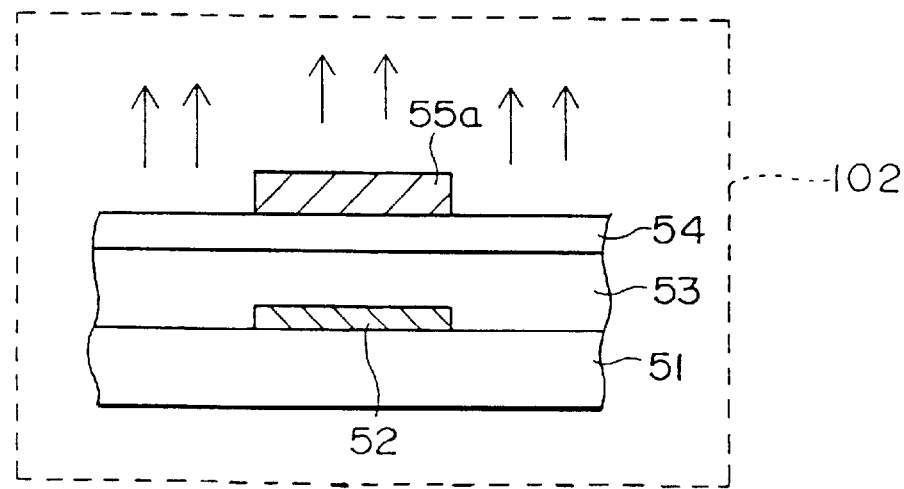

For the inverted-stagger-type TFT fabrication method, the channel protective coat 55a is formed by masking the resist pattern 56a as shown in FIG. 16A. In this case, a contaminated layer 78 may be formed on the channel protective coat 55a and a-Si film 54 as shown in FIG. 16B. The layer 78 is formed in the wet etching step or due to contamination of the atmosphere stored after patterning. Because the contaminated layer 78 causes imperfect contact, it is necessary to remove it before the next step starts.

Therefore, to selectively deposit an a-Si film on the surface of the a-Si film 54 by using the film forming system shown in FIG. 11, it is necessary to remove the contaminated layer 78 by hydrogen plasma etching.

That is, the substrate 51 is set into the chamber 71 of the film forming system to exhaust the gas in the chamber and thereafter the substrate temperature is set to 200° C. or lower, hydrogen gas is introduced through the gas introduction port 72, and an RF power is applied between the wafer holder 75 and electrode 76 to generate electric discharge. Thus, as shown in FIG. 16C, the hydrogen plasma atmosphere 102 is formed around the substrate 51. It is also possible to use halogen system gas such as $SiF_4$, $CCl_4$ instead of hydrogen gas.

Because the hydrogen plasma etches the contaminated layer 78 on the a-Si film 54 and channel protective coat 55a, the surfaces of the films 54 and 55a are cleaned. In this case, it is also possible to improve the etching effect by applying a laser beam or electron beam onto the a-Si film 54 and channel protective coat 56a simultaneously with the plasma discharge.

After cleaning is completed, the step starts in which the contact layer or source/drain electrode described in the second embodiment is selectively deposited.

Though the method for removing the contaminated layer can be applied to the case in which the contact layer of a stagger-type TFT is selectively deposited before cleaning the surface, it can be also applied to the case in which the contact layer is formed by the plasma CVD unselectively.

To form the contact layer by the normal plasma CVD, the surface of a silicon film serving as the contact layer is contaminated because it is necessary to pattern the silicon film. Therefore, it is necessary to clean the surface of the contact layer before depositing an active semiconductor layer. The following is the brief description of the step.

Figure 17A:
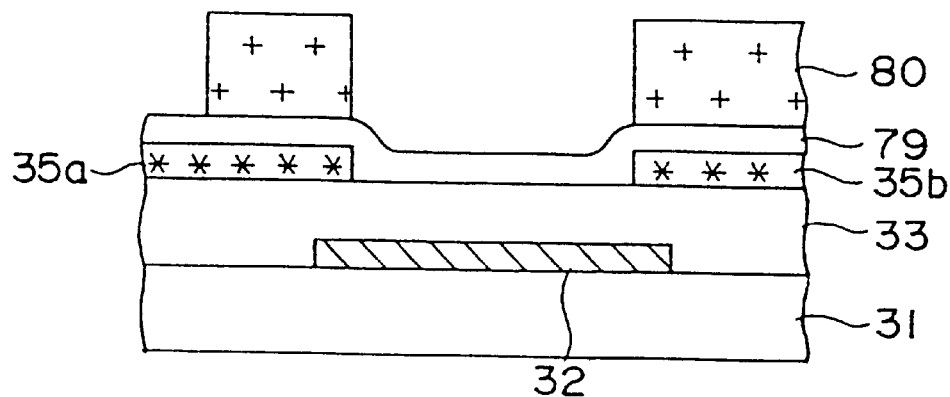

First, as shown in FIG. 17A, an a-Si film 79 is chemical-vapor-deposited on the source electrode 35a and drain electrode 35b above the substrate 31. Then, to form a contact layer, the a-Si film 79 is selectively etched by using a resist pattern 80 as a mask and thereafter the resist pattern 80 is removed. Thus, contact layers 79a and 79b are formed.

Figure 17B:
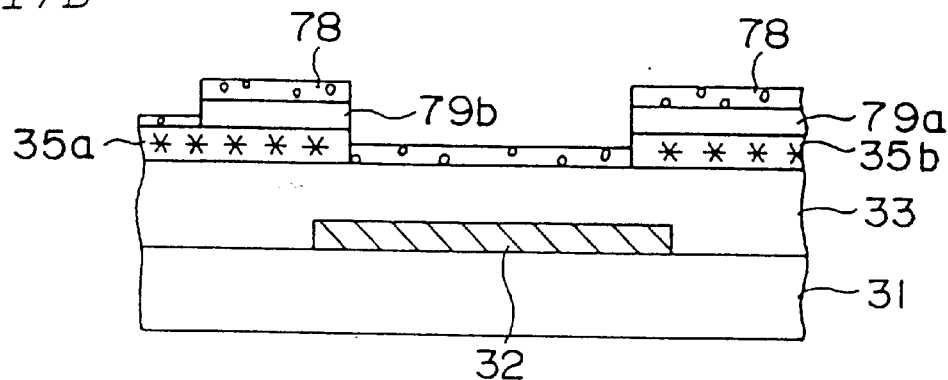

If the contaminated layer 78 is formed on the insulating film 33 and a-Si film 79 after patterning the layers, it is necessary to remove the contaminated layer 78 before forming an active semiconductor layer on the films as shown in FIG. 17B.

Figure 17C:
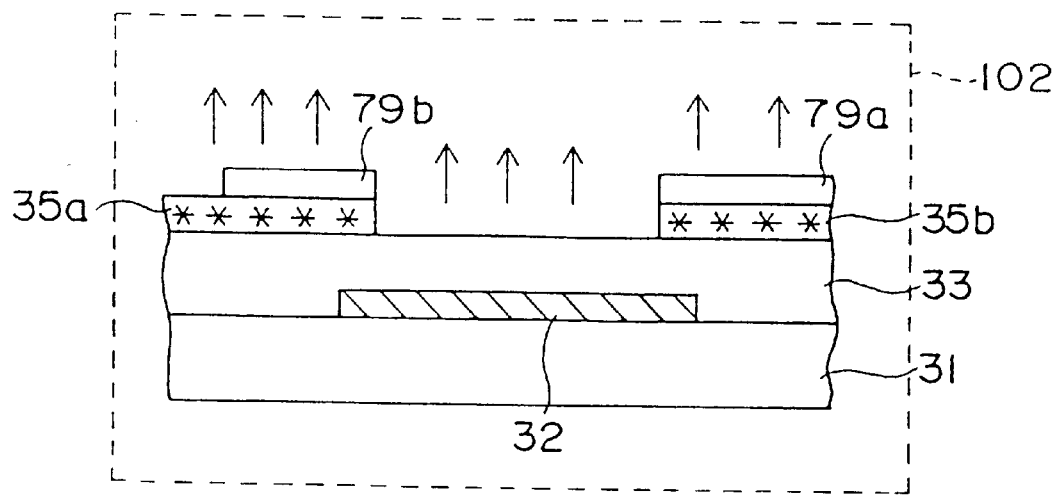

Also in this case, the substrate 31 is set into a reaction chamber of a plasma CVD system to remove the contaminated layer 78 by generating the hydrogen plasma shown in FIG. 17C in the reaction chamber before forming the active semiconductor layer. The hydrogen-plasma generating conditions are the same as the conditions for removing the contaminated layer 78 in FIG. 16C.

Figure 17D:
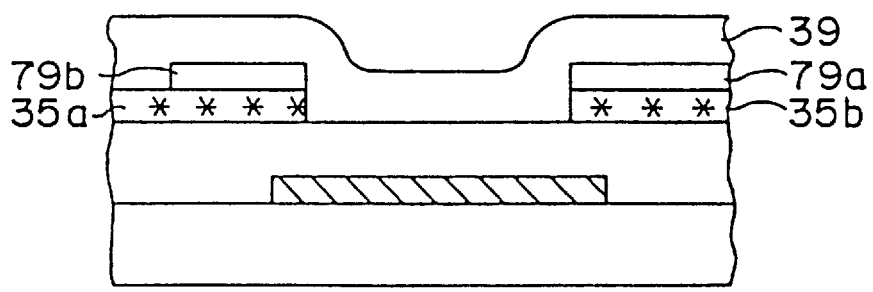

Thereafter, as shown in FIG. 17D, the a-Si film 39 serving as an active semiconductor layer is formed on the clean a-Si film 79.

As described above, to remove the contaminated layer 78 by using hydrogen plasma, the film quality can be prevented from deteriorating due to entering of hydrogen into the film by setting the substrate temperature to 200° C. or lower. For example, an a-Si film serving as a contact layer or an active semiconductor layer deteriorates by reacting on the hydrogen entering the film.

A stagger-type TFT may have a region which is a part of a conductive film of ITO or TiN made of oxide or nitride and is not covered with a contact layer. However, the conductive film is active for halogen plasma (excitation species) of hydrogen, chlorine, or fluorine. Particularly, when the substrate temperature is high, the oxide or nitride is reduced by hydrogen plasma atmosphere or halogenated to change in quality, and resultingly causes the conductivity of the conductive film to decrease.

For example, when the conductive film is made of indium oxide, the film may be reduced by hydrogen in hydrogen plasma, its resistance may increase and also it may be blackened and its light transmittance may decrease if the substrate temperature is higher than 200° C. However, by keeping the substrate temperature at 200° C. or lower, the characteristics are prevented from degrading due to change of properties of the conductive film, in other words, the conductivity of the transparent conductive film is prevented from decreasing due to change of properties of the film or light transmittance of the film is prevented from decreasing due to change in color of the film.

Another reason to decrease the substrate temperature lies in the fact that the etching rate of the conductive film in the plasma atmosphere 102 greatly depends on temperature.

For example, etching of an a-Si film by hydrogen plasma is caused by the fact that hydrogen combines with silicon and volatilizes as polysilane gas such as $SiH_4$ or $Si_2H_6$. However, when the substrate temperature is high, the probability for the surface of the a-Si film or glass substrate to change to polysilane gas decreases because hydrogen deeply diffuses into the a-Si film or the glass substrate under the film. However, when the substrate temperature is 200° C. or lower, the speed of diffusion of hydrogen into the a-Si film or substrate decreases and the quantity of hydrogen on the substrate surface increases. As a result, the surface of the a-Si film easily changes to silane gas.

The same is true for etching of the surface of the glass substrate by hydrogen plasma.

Figure 18:
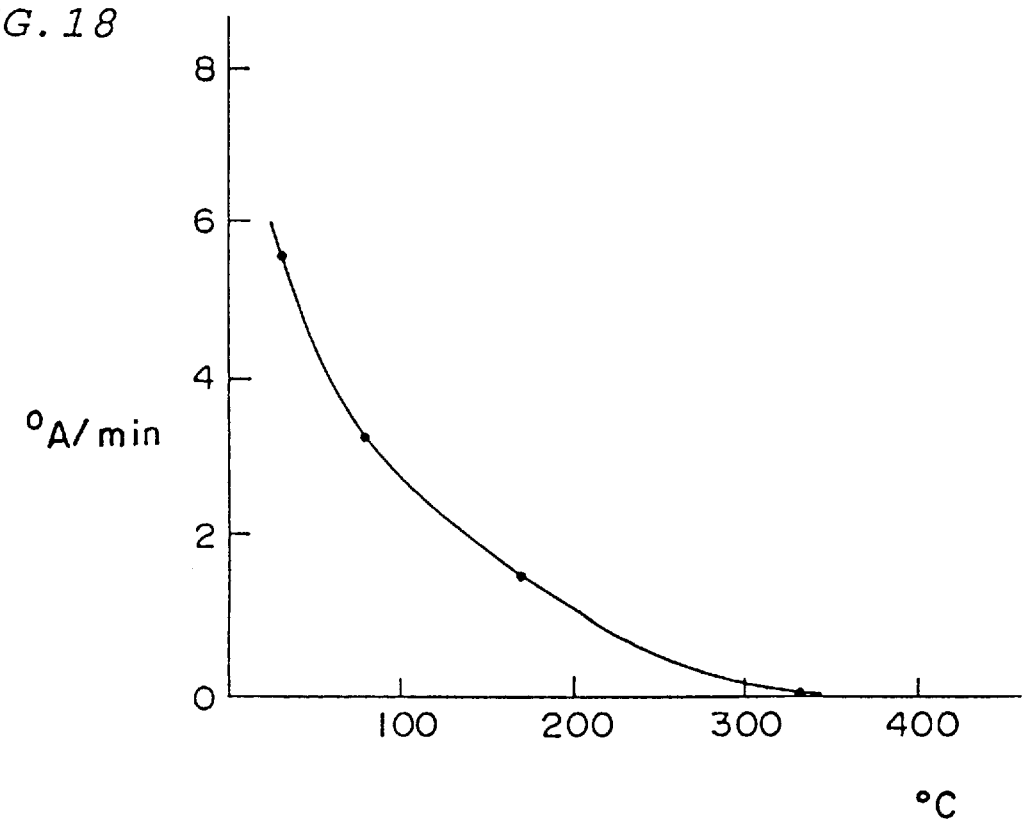
FIG. 18 is an illustration showing the relationship between substrate temperature and etching rate for explaining the etching characteristic of the silicon film used for each embodiment of the present invention.

FIG. 18 is a characteristic diagram showing the relationship between substrate temperature and etching rate of an a-Si film. In FIG. 18, the axis of ordinates shows etching rate of the a-Si film by hydrogen plasma etching and the axis of abscissas shows substrate temperature.

From FIG. 18, it is found that the etching rate tends to rise when lowering the substrate temperature in etching the a-Si film by hydrogen plasma. Therefore, for the etching rate requested for the fabrication step in mass production, it is desirable to set the substrate temperature to 200° C. or lower. The etching rate for the substrate temperature of 200° C. in FIG. 18 is approx. 2 Å/min.

Though the characteristic diagram in FIG. 18 shows measurement results, almost same etching characteristic is shown for other semiconductor layers.

As described above, the effect for cleaning the a-Si film surface is improved by keeping the substrate temperature at 200° C. or lower, for example, at the room temperature and increasing the etching rate.

Moreover, even if an ITO film is exposed in the cleaning step, the film is not deteriorated. Furthermore, because a plasma CVD system widely used as an etching system in general can be used, it is possible to not only decrease the system development cost but continuously perform surface cleaning and film forming while keeping the vacuum state in the same plasma CVD system and completely prevent the cleaned surface from being recontaminated.

It is also possible to decrease damages due to impact of heavy positive ions by setting a substrate to the ground electrode side. Though this embodiment uses an ITO film as a conductive film. However, the conductive film is not restricted to the ITO film. The same effect can be obtained from an oxide conductive material such as tin oxide or NiO or a nitride conductive material such as TiN. As means for preventing hydrogen from entering, there is a method for decreasing the hydrogen-ion incoming energy by controlling the substrate bias.

(6) Sixth Embodiment

For the above-mentioned embodiments, hydrogen plasma etching and vapor deposition are performed in the same chamber of the film forming system shown in FIG. 11. However, as shown in FIG. 19, it is also possible to use a combination-type plasma reaction system made by setting a vapor deposition chamber and an etching chamber separately and combining them.

Figure 19:
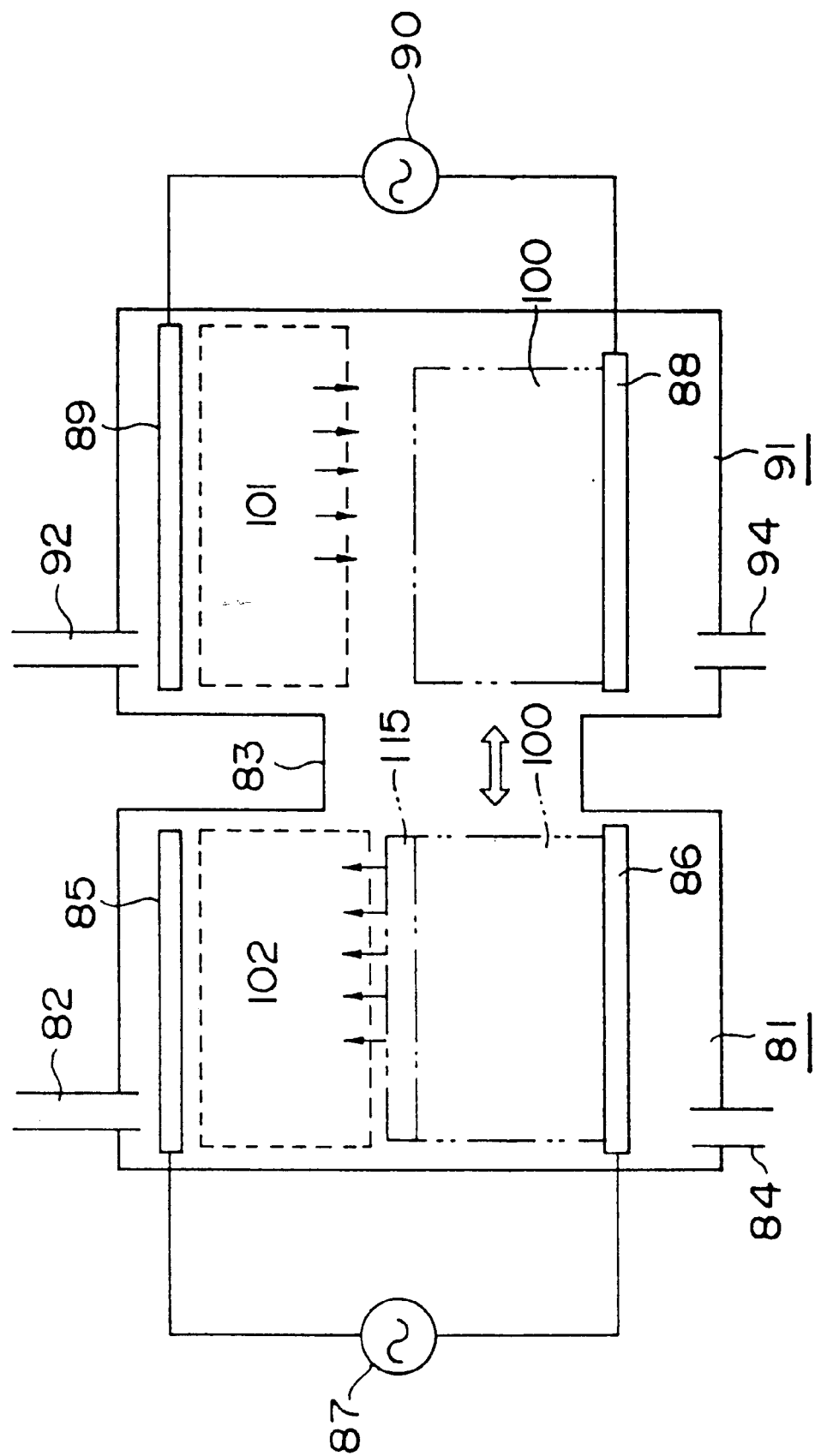
FIG. 19 is a block diagram of another film forming system used for each embodiment of the present invention.

In FIG. 19, a plasma etching system 81 and a vapor deposition system 91 are connected each other by a connection passage by keeping a high airtightness.

That is, as shown in FIG. 19, the plasma etching system 81 for etching a film on a substrate 100 comprises an etching gas supply tube 82, an exhaust port 84, an electrode-cum-susceptor (hereafter referred to as susceptor) 86, an electrode 85, and an RF power supply 87. The vapor deposition system 91 for depositing a film on the substrate 100 comprises an electrode-cum-susceptor (hereafter referred to as susceptor) 88, an electrode 89, a material gas introduction tube 92, an RF power supply 90, and an exhaust port 94.

For example, to clean a contaminated layer 115 on the substrate 100, first, the substrate 100 is mounted on the susceptor 86 in the plasma etching system 81 and the system is exhausted. Then, etching gas is introduced through the etching gas introduction tube 82 and an RF voltage is applied between the susceptor 86 and the electrode 85 to generate plasma discharge and form the plasma atmosphere 102 around the substrate 100. Thus, the contaminated layer 115 is etched and the substrate 100 is cleaned.

Then, to perform film forming, the substrate 100 is transferred from the plasma etching system 81 to the vapor deposition system 91 to mount it on the susceptor 88. Then, a material gas is introduced through the material gas introduction tube 92, an RF voltage is applied between the susceptor 88 and the electrode 89 to generate plasma discharge and form the plasma atmosphere 101 around the substrate 100. An a-Si film or the like is deposited on the substrate 100 by the reaction gas transformed into plasma.

When the plasma etching system 81 for cleaning a surface and the vapor deposition system 91 for depositing a film are separately set as above mentioned, a temperature optimum for etching and that for film deposition can be obtained-respectively.

For example, to remove the contaminated layer 115 from the substrate 100 made of a-Si by hydrogen plasma, the time for adjusting the temperature in the reaction chamber is not required by etching the layer at the room temperature from which a large etching rate is obtained as described in the above embodiments. When a film deposited on the substrate 100 is made of a-Si, an excellent film quality is obtained by setting the substrate temperature to 200° C.

For a single-wafer-processing system for performing surface cleaning and film forming in the same reaction chamber, it is necessary to alternately control the cleaning temperature and deposition temperature. In this case, the time for cooling and heating becomes useless and thereby the productivity decreases.

For the system shown in FIG. 19, however, the plasma etching system 81 and vapor deposition system 91 are connected by the connection passage 83 and a temperature suitable for cleaning and that suitable for film forming are independently controlled in each reaction chamber. Therefore, it is possible to decrease the time from preparation for the substrate 100 to surface treatment of it. It is free to use the cleaning chamber as a preparation chamber or set a preparation chamber separately in order to prevent the atmosphere from entering.

(7) Seventh Embodiment

The following is the description of film surface cleaning in the stagger-type TFT fabrication step.

Figure 20A:
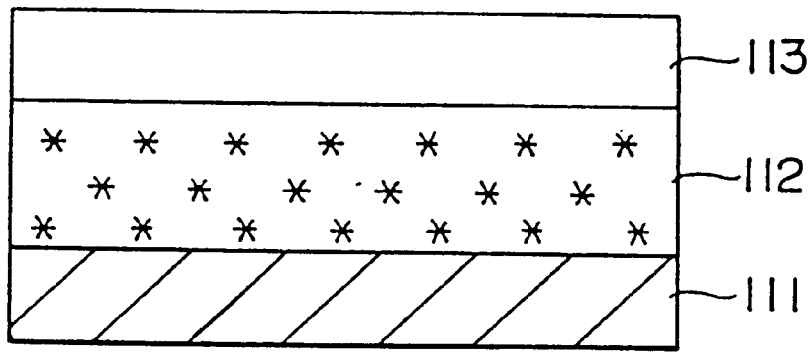
FIGS. 20A to 20F are sectional views showing the step of forming the stagger-type TFT of the eighth embodiment of the present invention.

First, as shown in FIG. 20A, a transparent conductive film 112 made of indium oxide added with tin and a semiconductor layer 113 serving as a contact layer are continuously deposited on a glass substrate 111 by means of vapor deposition.

Figure 20B:
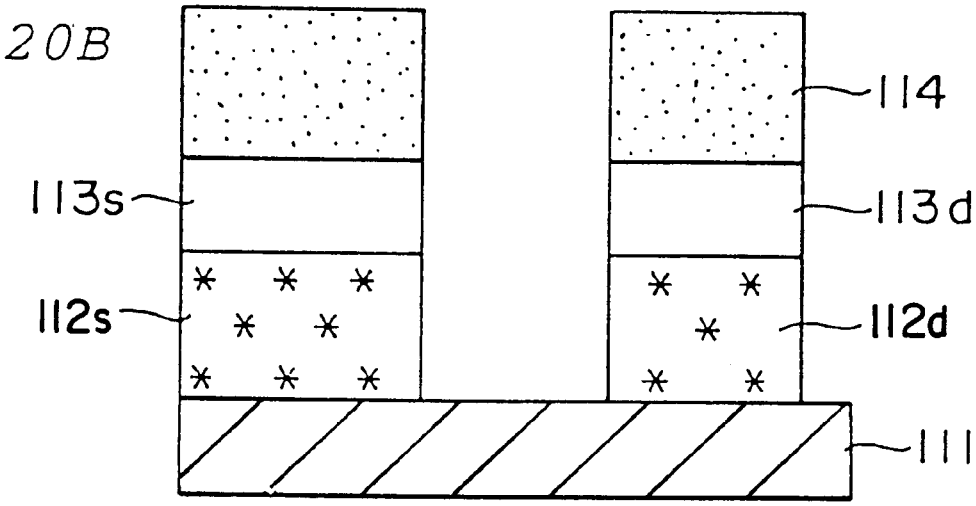

Then, as shown in FIG. 20B, a resist pattern 114 is formed on the semiconductor layer 113 to form a source electrode 112s, drain electrode 112d, and not-illustrated picture-element electrode by using the resist pattern 114 as a mask to pattern the semiconductor layer 113. In this case, the semiconductor layer on the source electrode 112s, shown in FIG. 20B and drain electrode 112d serves as a contact layer 113s for source and contact layer 113d for drain and the semiconductor layer 113 on the picture-element electrode serves as a protective coat.

Figure 20C:
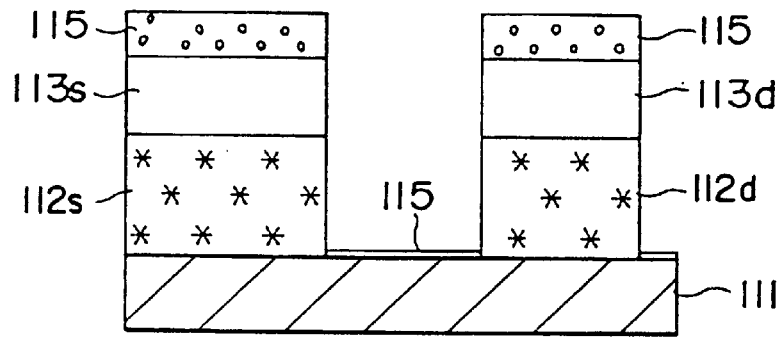

After the resist 114 is removed, the contaminated layer 115 made of resist residue is present on the semiconductor layer 113 and glass substrate 111 as shown in FIG. 20C. At this phase, it is possible to previously remove a thick oxide layer from the entire substrate by using buffer hydrofluoric acid or the like. In this case, surface cleaning by plasma to be mentioned later is completed only by removing the remaining thin oxide film.

Figure 20D:
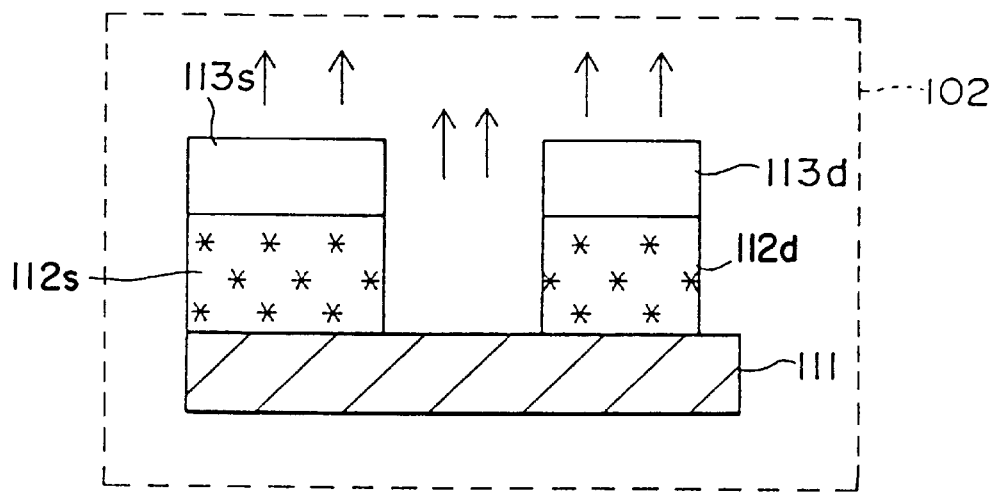

Then, the glass substrate 111 is set to the plasma etching system 81 shown in FIG. 19. In this case, the reaction chamber of the system 81 is roughly evacuated up to $3 \times 10^{-6}$ Torr and thereafter the substrate temperature is kept at 200° C. to set the pressure of the atmosphere to 0.6 Torr by supplying hydrogen at the flow rate of 300 sccm, and moreover an RF power of 13.56 MHz and 200 W is applied between the electrodes 85 and 86 to generate hydrogen plasma between the electrodes. Thus, as shown in FIG. 20D, the contaminated layer 115 is removed from the contact layers 113s and 113d and the glass substrate 111.

For this etching, the transparent conductive film 112 is prevented from deteriorating because the contact layers 113s and 113d also serve as protective coats for the transparent conductive film. In this case, if the substrate temperature is set to 200° C., the film quality is degraded because hydrogen entering the gap between the contact layer 113s for source also serving as a protective layer and the contact layer 113d for drain reacts on silicon.

However, because the substrate temperature is set in the range from 200° C. to the room temperature (25° C.) for this embodiment, the film quality is prevented from degrading due to hydrogen plasma. Moreover, it is possible to prevent hydrogen from entering the semiconductor layer 113 and glass substrate 111 by decreasing the energy for hydrogen ions to enter the glass substrate 11. Decrease of the energy can be achieved by raising the bias applied to the glass substrate 111.

Figure 20E:
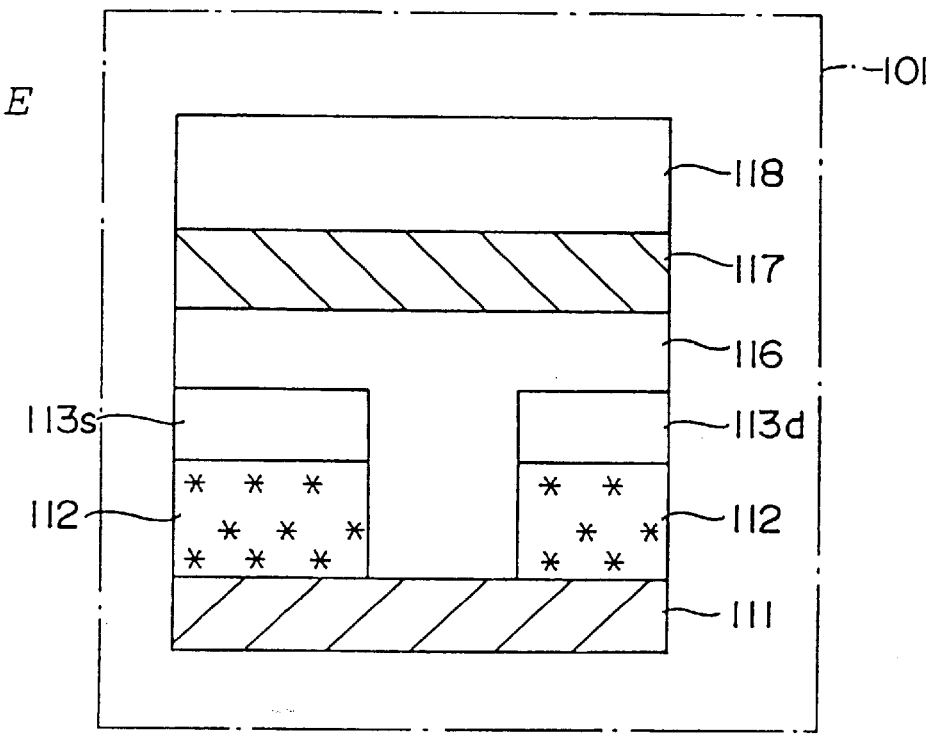

Then, as shown in FIG. 20E, the contaminated layer 115 is removed and thereafter the glass substrate 111 is transferred from the plasma etching system 81 to the vapor deposition system 91 to continuously form a semiconductor layer 116 made of an amorphous silicon layer and a gate insulating film 117 made of a SiNx layer in the system 91.

Thereafter, the glass substrate 111 is taken out of the vapor deposition system 91 and then a metallic film made of aluminum or the like is formed on the gate insulating film 117 through sputtering and patterned through lithography to form a gate electrode 118 and a gate bus line (not illustrated) in a gate region.

Figure 20F:
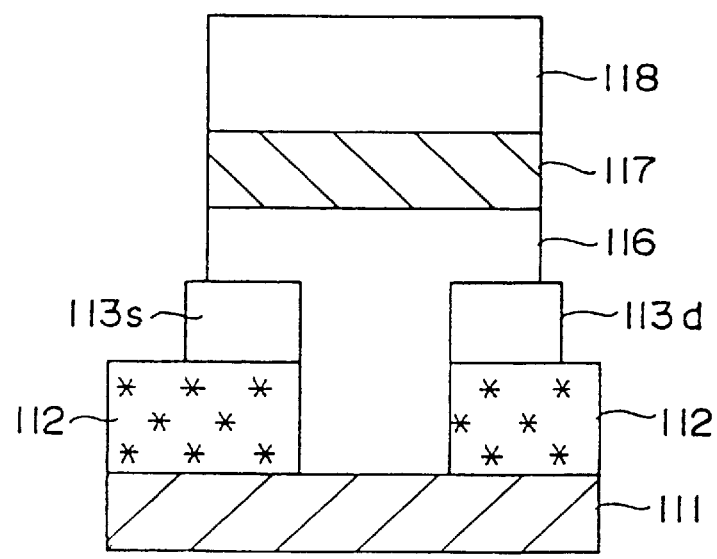

After etching is applied from the gate insulating film 117 to the contact layers 113s and 113d by using the gate electrode as a mask, a stagger-type TFT with the cross section shown in FIG. 20F is formed.

For the above method for fabricating a stagger-type thin-film transistor, the transparent conductive film 112 does not contact hydrogen plasma in etching the contaminated layer 115 because the transparent conductive film 112 is protected by the semiconductor layer 113 constituting the contact layers 113s and 113d. Therefore, damages of the transparent conductive film 112 are decreased. Moreover, by setting the then substrate temperature to 200° C. or lower, for example, to the room temperature, damages of the semiconductor layer and conductive layer can be decreased.

Thus, in spite of a simple process, impurities on the interface between the contact layers 113s and 113d and the semiconductor layer 116 can be greatly decreased. Therefore, the step is superior in mass production of the transistor concerned.

For this embodiment, the transparent conductive film in the region other than the source and drain regions are covered with a semiconductor film in etching a contaminated layer. However, it is also possible to cover the region with a pattern of a silicon nitride film or the like before starting the cleaning step.

(8) Eighth Embodiment (i) Before describing the eighth embodiment, the following three samples are prepared to examine the concentration of the elements contained in the samples through the secondary ion mass spectrometry (SIMS).

Figure 21A:
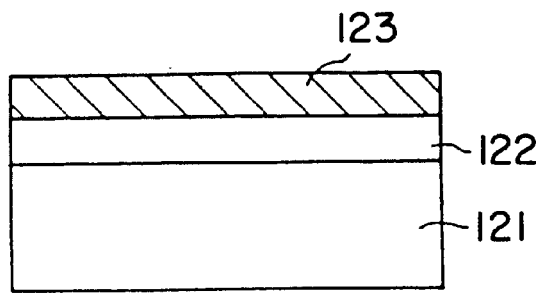
FIG. 21A is a sectional view showing the laminated state before forming a sample and FIG. 21B is a sectional view of a sample 1 for explaining the present invention.
Figure 21B:
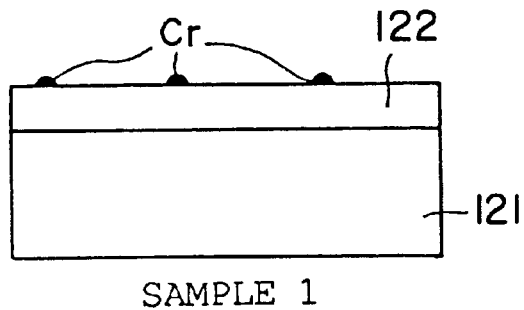

The sample 1 is formed by depositing a silicon nitride film 122 on a glass substrate 121 through CVD, further laminating a chromium film 123 on the silicon nitride film 122 through DC sputtering as shown in FIG. 21A and thereafter etching the chromium film 123 at the room temperature to expose the silicon nitride film 122 as shown in FIG. 21B. The etcher for chromium uses a mixed aqueous solution of ammonium cerium (IV) nitrate and perchloric acid. The end point of etching is assumed as the timing when chromium is visually completely removed.

Figure 22:
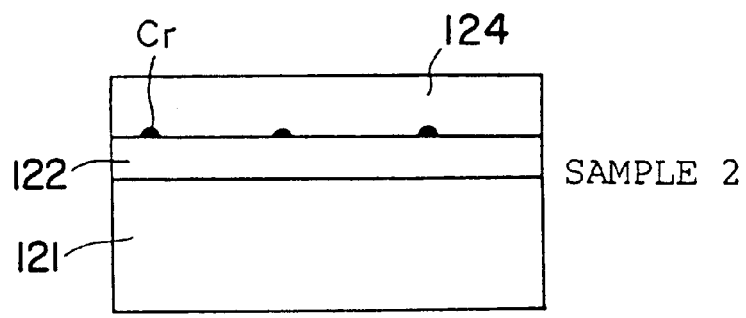
FIG. 22 is a sectional view of a sample 2 for explaining the present invention.

The sample 2 is obtained by etching the chromium film 123 shown in FIG. 21A until it cannot be seen with the naked eye before repeating the deposition and etching of silicon a plurality of times by using the method described in the literatures [1] and [2] shown in the section of BACKGROUND OF THE INVENTION. As the result of setting the deposition time to 2 to 6 sec and the etching time to 40 to 60 sec, a silicon film 124 is deposited on the surface of the silicon nitride film 122 as shown in FIG. 22.

Figure 23:
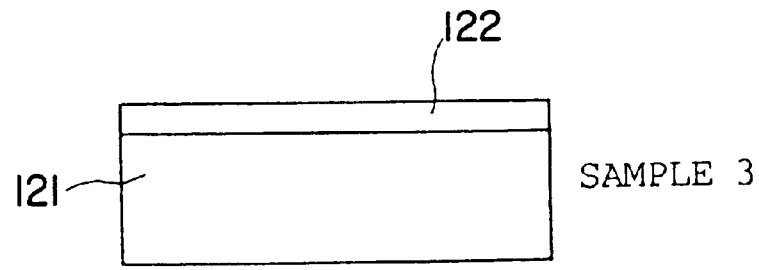
FIG. 23 is a sectional view of a sample 3 for explaining the present invention.

The sample 3 is formed by etching the chromium film 123 shown in FIG. 21A until it cannot be seen with the naked eye and then slightly etching the surface of the silicon nitride film 122 with aqueous solution of diluted hydrofluoric acid before repeating deposition and etching of silicon under the same conditions as those of the sample 2. As a result, as shown in FIG. 23, no silicon film is deposited on the surface of the silicon nitride film 122.

Those silicon nitride films 122 are deposited by setting the substrate temperature to 400° C. and the hydrogen content in the films is 10% or lower.

The silicon nitride films 122 of these three samples are equivalent to, for example, the base-material insulating films of a source electrode and drain electrode of a stagger-type TFT and the substrate insulators contact the active semiconductor layer of the TFT. Therefore, to selectively deposit silicon containing impurities serving as a contact layer on the source and drain electrodes of the TFT, it is necessary to prevent the impurity-contained silicon from depositing on the silicon nitride film 122 in order to prevent the source and drain electrodes from being shorted.

Figure 24A:
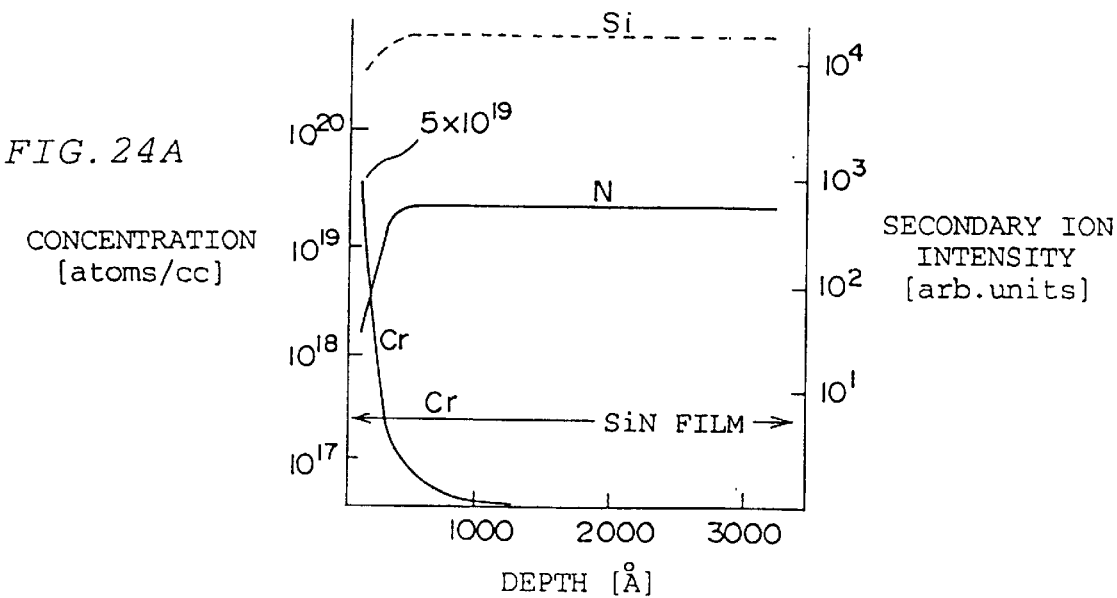
FIGS. 24A to 24C are element concentration distribution charts showing the results of SIMS analysis on the samples 1 to 3.
Figure 24B:
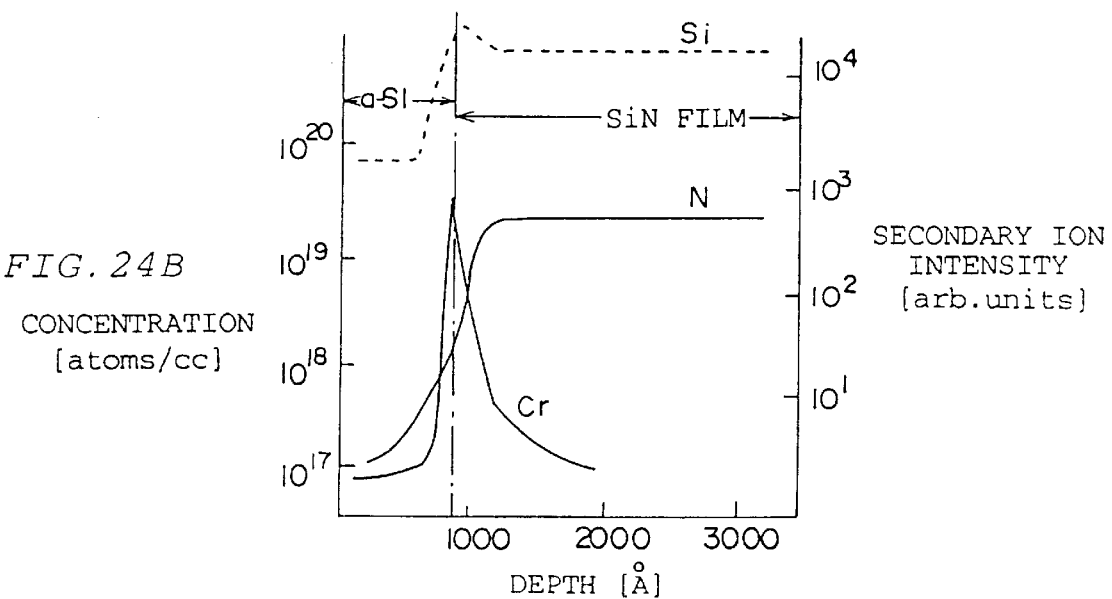
Figure 24C:
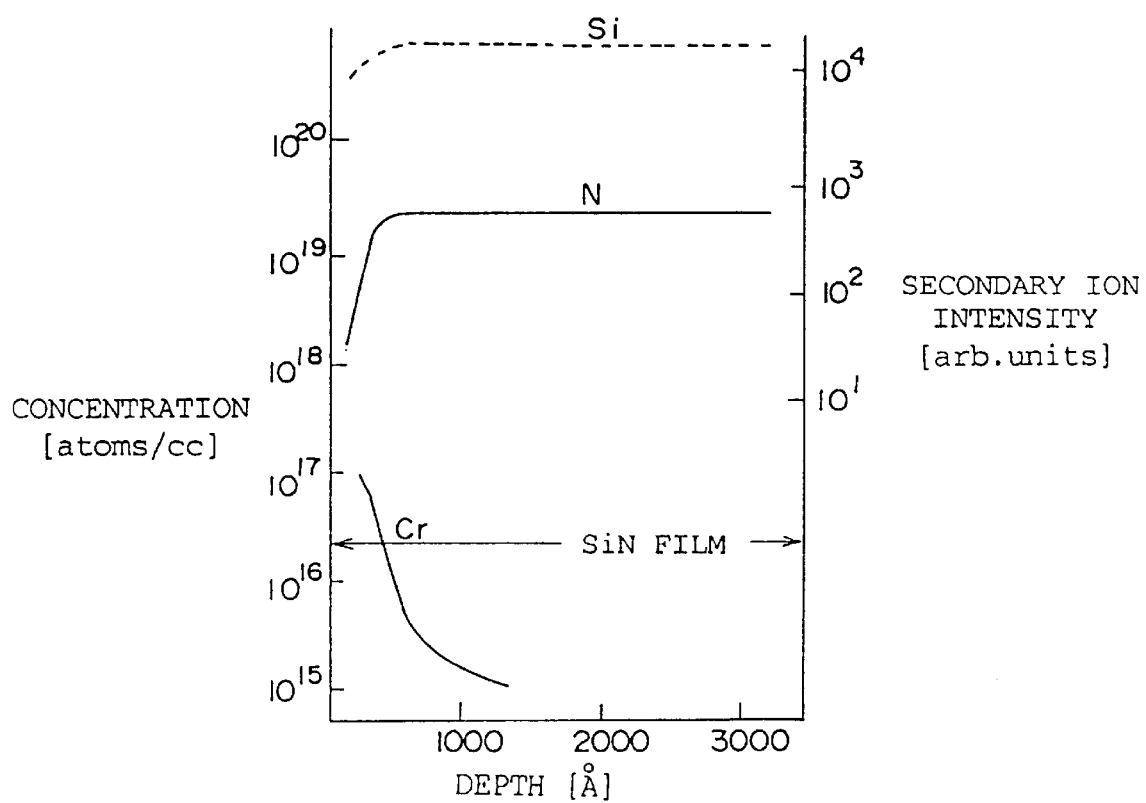

As the result of analyzing the above three samples through the secondary ion mass spectrometry (SIMS), the results shown in FIGS. 24A to 24C are obtained. The axes of ordinates at the left of these graphs show values obtained by converting secondary ion intensity of chromium into concentration and the axes of ordinates at the right of them show a relative secondary ion intensity to nitrogen and silicon and the axes of abscissas of them shows depth from the surface of each sample.

From the results of SIMS on the sample 1, as shown in FIG. 24A, it is found that chromium of $5\times10^{19}$ atoms/cm$^3$ remains on the surface of the silicon nitride film 122 immediately after etching of chromium. When assuming the atomic density of the silicon nitride film 122 as $5\times10^{22}$ atoms/cm$^3$, the chromium density is equivalent to 0.1%. The chromium density does not change even after doubling the chromium etching time in forming the sample.

From the results of SIMS on the sample 2, as shown in FIG. 24B, it is found chromium atoms almost same as those of the sample 1 are present on the surface of the silicon nitride film 122 and the remaining quantity of chromium does not change before and after selective deposition of silicon.

From the results of SIMS, as shown in FIG. 24C, it is found that the number of chromium atoms on the surface of the silicon nitride film 122 is as small as approx. 1×1017 atoms/cm.

Therefore, to selectively deposit silicon, the number of contaminated atoms on the surface of a substrate insulator for preventing silicon from depositing must be less than 0.1% to the atomic density of the substrate and it is requested that the film surface is clean.

The following is the description of a method for decreasing the time of selective deposition process and improving the reproducibility and yield.

(ii) Description of embodiments

FIGS. 25A to 25F are sectional views showing the step of fabricating a stagger-type TFT of the eighth embodiment of the present invention.

Figure 25A:
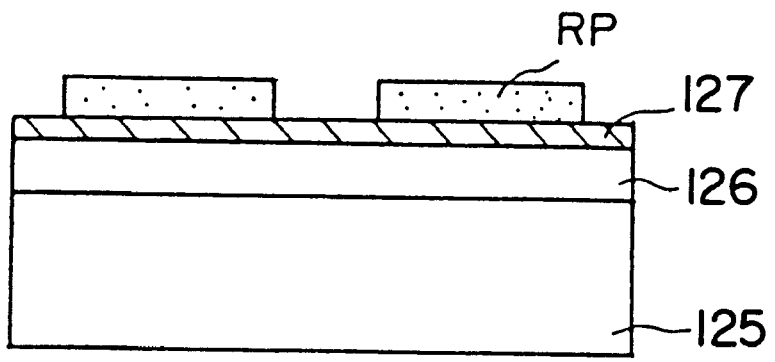
FIGS. 25A to 25F are sectional views showing the step of fabricating a stagger-type TFT of the eighth embodiment of the present invention.

First, up to the state shown in FIG. 25A is described below.

First, a silicon nitride film 126 is formed up to the thickness of 3,000 Å on a transparent substrate 125 made of glass or quartz through the plasma CVD. To deposit the film, SiH$_4$, NH$_3$, and H$_2$ are introduced into the atmosphere where the transparent substrate 125 is set at the flow rates of 10, 40, and 250 sccm respectively. Then, the pressure of the atmosphere is set to 1.0 Torr, the substrate temperature is set to 100 to 230° C., and an RF power to be applied between electrodes is set to 300 W.

Then, a chromium film 127 is formed on the silicon nitride film 126 up to the thickness of 1,000 Å through the DC sputtering.

Then, resist is applied, exposed, and developed to form a resist pattern RP for covering the chromium film 127 in source and drain regions. Thereafter, the chromium film 127 is wet-etched by using the resist pattern RP as a mask. The etching solution uses a mixed solution of ammonium cerium (IV) nitrate and perchloric acid. Thereafter, the resist pattern RP is removed.

Figure 25B:
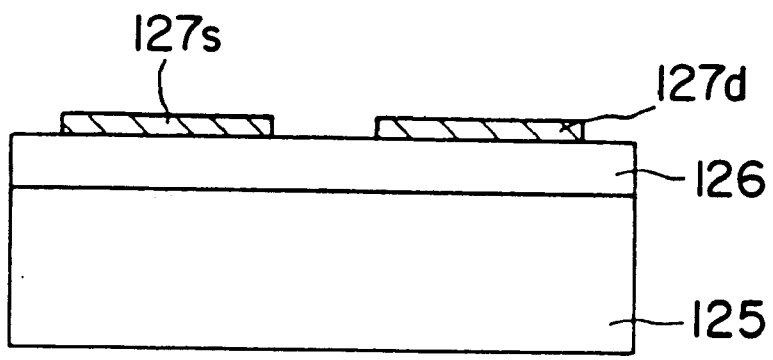

Thus, a source electrode 127s and drain electrode 127d made of a chromium film shown in FIG. 25B are formed.

Figure 25C:
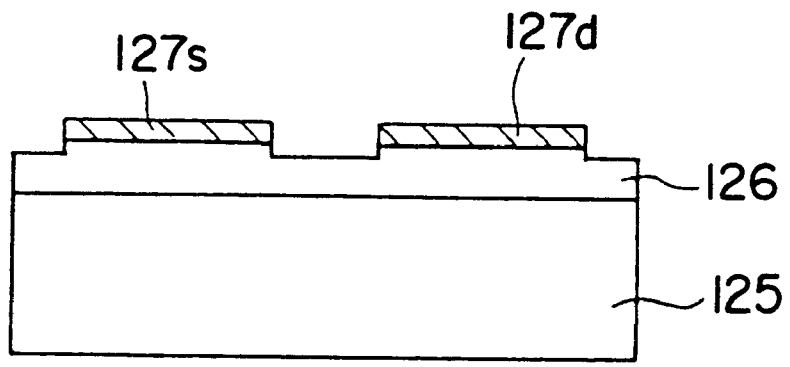

Then, as shown in FIG. 25C, chromium residue on the silicon nitride film 126 is removed by slightly etching the surface of the film 126 with aqueous solution of diluted hydrofluoric acid.

Thereafter, the transparent substrate 125 is put in, for example, the chamber 71 of the plasma CVD system shown in FIG. 11, $H_2$ is introduced at the flow rate of 400 sccm, the RF power to be applied between electrodes is set to 450 W, and the pressure in the chamber 71 is set to 0.6 Torr. Thereby, hydrogen plasma is generated in the chamber 71 to remove contaminant from the surface of the transparent substrate 125. Thus, the growth species of silicon is removed from the surface of the transparent substrate 125 and the surface is cleaned.

Then, the step of forming a contact layer on the source electrode 127s and drain electrode 127 is started by using the same plasma CVD system. The contact layer is formed through selective deposition in which deposition and etching is repeated. The selective deposition is described below.

Etching for selective deposition is performed for 47 sec by steadily introducing $H_2$ into the chamber 71 at the flow rate of 400 sccm, setting the gas pressure to 0.6 Torr and the RF power to be applied between electrodes to 200 W, and using thus-generated hydrogen plasma. For deposition, $SiH_4$ and $PH_3$ are supplied into the hydrogen plasma atmosphere at the flow rates of 25 and 150 sccm for 3 sec respectively to deposit silicon. An $n^+$-type fine-crystal silicon film is formed on the source electrode 127s and drain electrode 127d up to the thickness of 30 Å by assuming the deposition and etching as one cycle and repeating them by 30 cycles. It is also possible to stop introduction of hydrogen for deposition.

Figure 25D:
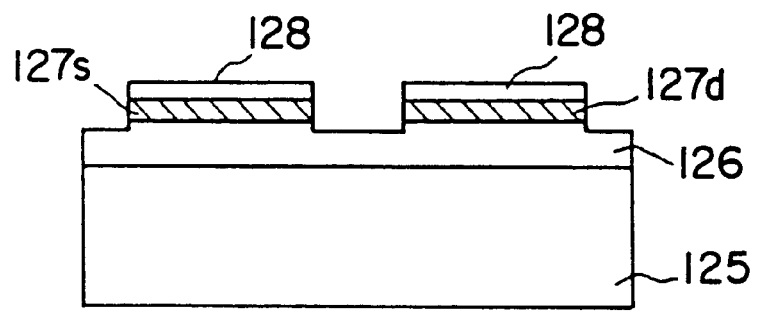

The silicon film serves as a contact layer 128 as shown in FIG. 25D.

Figure 25E:
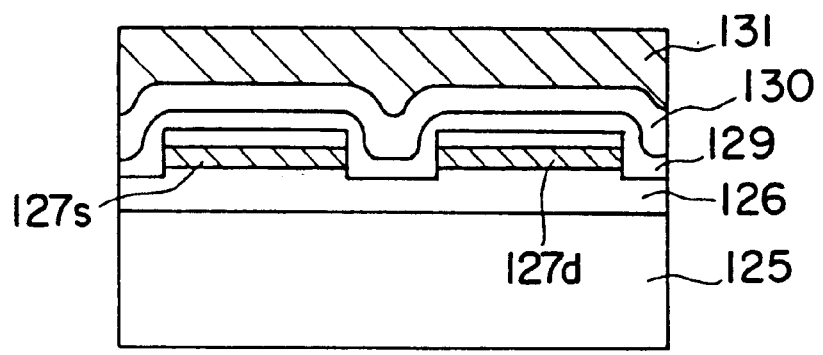

Then, the transparent substrate 125 is transferred to another CVD system while keeping vacuum to laminate an amorphous silicon layer 129 serving as an active semiconductor layer up to the thickness of 800 Å and continuously form a silicon nitride film 130 serving as a gate insulating film on the layer 129 up to the thickness of 3,000 Å. Then, an aluminum film 131 is deposited up to the thickness of 3,000 Å through DC sputtering. The above laminated state is shown in FIG. 25E.

Figure 25F:
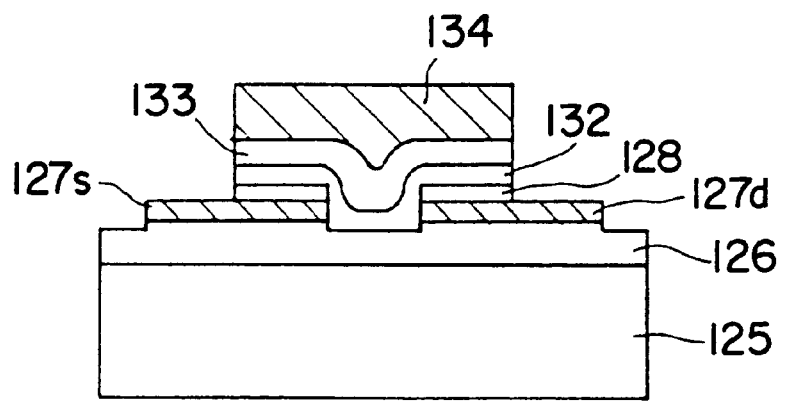

Then, a resist pattern for forming a gate electrode is formed to continuously pattern the aluminum film 131, silicon nitride film 130, amorphous silicon layer 129, and contact layer 128 by using the resist pattern as a mask. Thus, a contact layer 128, active semiconductor layer 132, and gate electrode 134 shown in FIG. 25F are formed on the silicon nitride film 126 serving as the substrate of the source electrode 127s and drain electrode 127d.

Thus, the stagger-type TFT is completed. To selectively deposit the $n^+$-type silicon film serving as the contact layer 128 in the above TFT fabrication step, it is important that no silicon is present on the surface of the silicon nitride film 126 in the region between the source electrode 127s and drain electrode 127d. If the silicon is present on the surface, current flows between the source electrode 127s and drain electrode 127d, and thereby-operations as a transistor are not performed or no adequate difference cannot be secured between on-current and off-current.

Figure 26A:
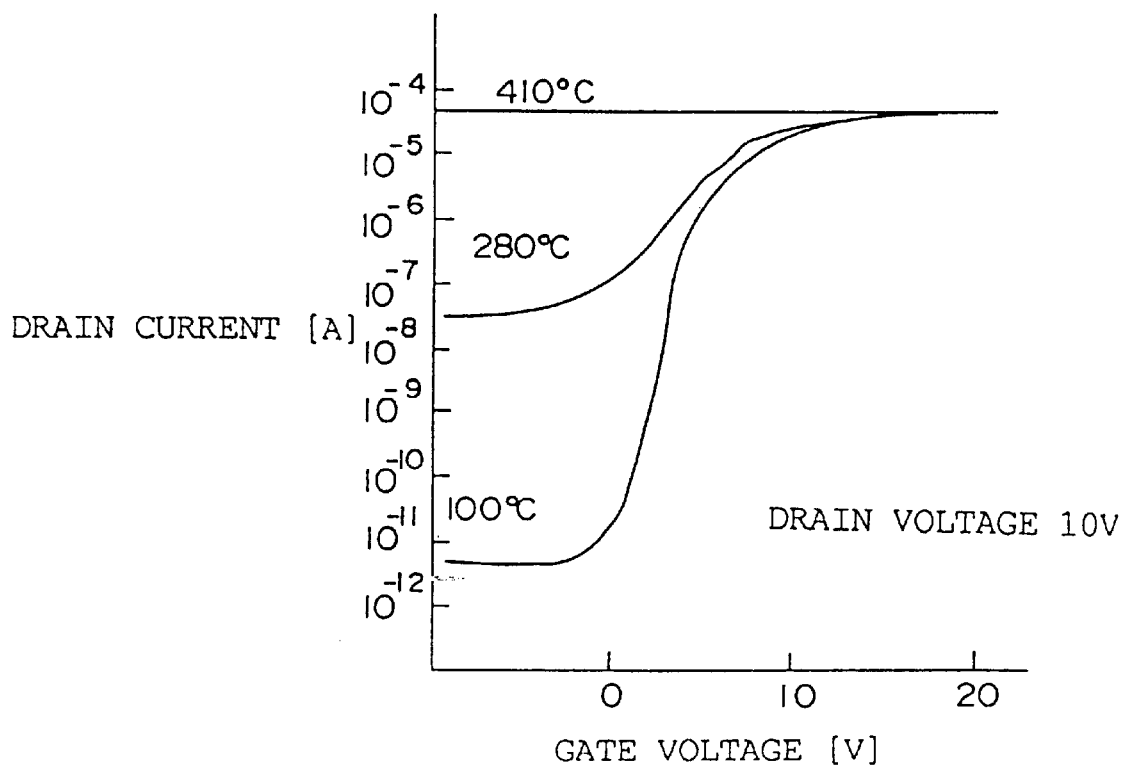
FIG. 26A is a transistor characteristic diagram showing the relationship between gate voltage and drain current when changing the deposition temperature of a silicon nitride film used for the TFT of the eighth embodiment of the present invention and FIG. 26B shows a combined state of atoms.

Therefore, the dependency of selective deposition due to the difference of the quality of the silicon nitride film 126 is examined. First, as the result of examining the characteristic of a stagger-type TFT transistor by making the deposition temperature of a silicon nitride film serving as the substrate of source and drain electrodes, the results shown in FIG. 26A are obtained. FIG. 26A shows the differences of the transistor characteristic when setting the silicon nitride deposition temperature to 100° C., 280° C., and 410° C. The TFT fabrication conditions other than the deposition temperature are the same.

For the film forming at the temperature of 410° C., the drain current does not depend on the gate voltage or switching characteristic does not occur. This is because $n^+$-type silicon is deposited on the surface of the silicon nitride film 126 between the source electrode 127s and drain electrode 127d.

As the deposition temperature is lowered from 410° C. to 280° C. and 100° C., the switching characteristic appears. Particularly for a TFT using the silicon nitride film 126 deposited at 100° C., the difference between on-current and off-current comes to approx. $1\times10^{-7}$ A and moreover, the on-current comes to approx. $1\times10^{-11}$ A. Thus, a characteristic enough to be applied to a liquid crystal display device is obtained. It is due to the following reasons that deposition of silicon depends on the difference of silicon nitride deposition temperature.

It is said that etching of silicon nitride or silicon oxide by hydrogen plasma is performed because of the fact that a hydrogen radical cuts the bond between silicon atoms or that between a silicon atom and other atom and silicon is bonded with hydrogen to volatilize as polysilane consisting of silane, disilane, and trisilane. However, the factor and function for controlling the reaction is not clarified.

For example, the reaction for silicon to volatilize as silane ($SiH_4$) is as shown below.

$$Si + 4H^* \rightarrow SiH_4\uparrow$$

Figure 26B:
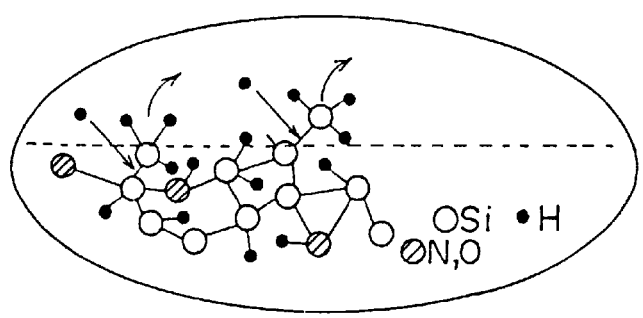

FIG. 26B shows the bonding state of atoms.

The hydrogen concentration of a substrate insulator of source and drain electrodes is conventionally decreased as lower as possible in order to secure the electrical insulating performance and prevent oxidation. For example, the hydrogen concentration is set to 10% for a silicon nitride film and almost 0% for a silicon oxide film.

For plasma etching of a silicon nitride film or silicon oxide film, hydrogen supplied to the surface of the film quickly diffuses into the film according to the hydrogen concentration gradient if the hydrogen concentration of the film is small. Therefore, it is found that the film is hardly etched because the hydrogen concentration on the film surface decreases. That is, the fact that the film is hardly etched means that many growth species remain on the film surface.

Therefore, the film forming conditions are changed, that is, the hydrogen concentration in the film is improved to prevent hydrogen from diffusing into the film in etching and the number of hydrogen radicals on the film surface is increased so that etching easily progresses. When decreasing the deposition temperature, the hydrogen concentration in the film increases.

The following is the description of the relationship between silicon nitride deposition temperature and remaining quantity of silicon. Because the both films contain silicon, it is difficult to discriminate the silicon nitride film from the silicon deposited on the film and thus directly detect them. Therefore, the quantity of silicon deposited on the silicon nitride film can be estimated by examining the phosphorus concentration on a silicon nitride film when selectively depositing silicon containing phosphorus on the film under the above conditions.

Silicon is selectively deposited on the source electrode 127s and drain electrode 127d up to the thickness of 30 Å to detect the phosphorus concentration on the silicon nitride film 126 around the silicon film. Then, as the result of examining the relationship between the deposition temperature of the silicon nitride film 126 and the phosphorus concentration on it, the relationship shown in FIG. 27 is obtained.

Figure 27:
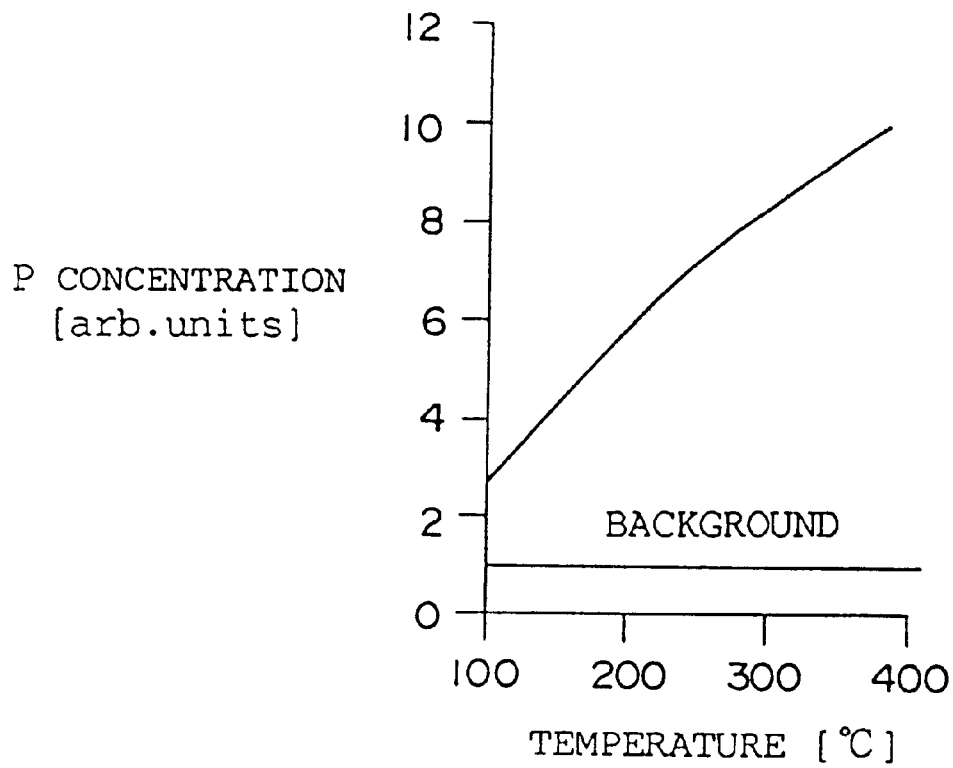
FIG. 27 is a characteristic diagram showing the relationship between deposition temperature of a silicon nitride film and phosphorus concentration on the surface of the silicon nitride film.
Figure 28:
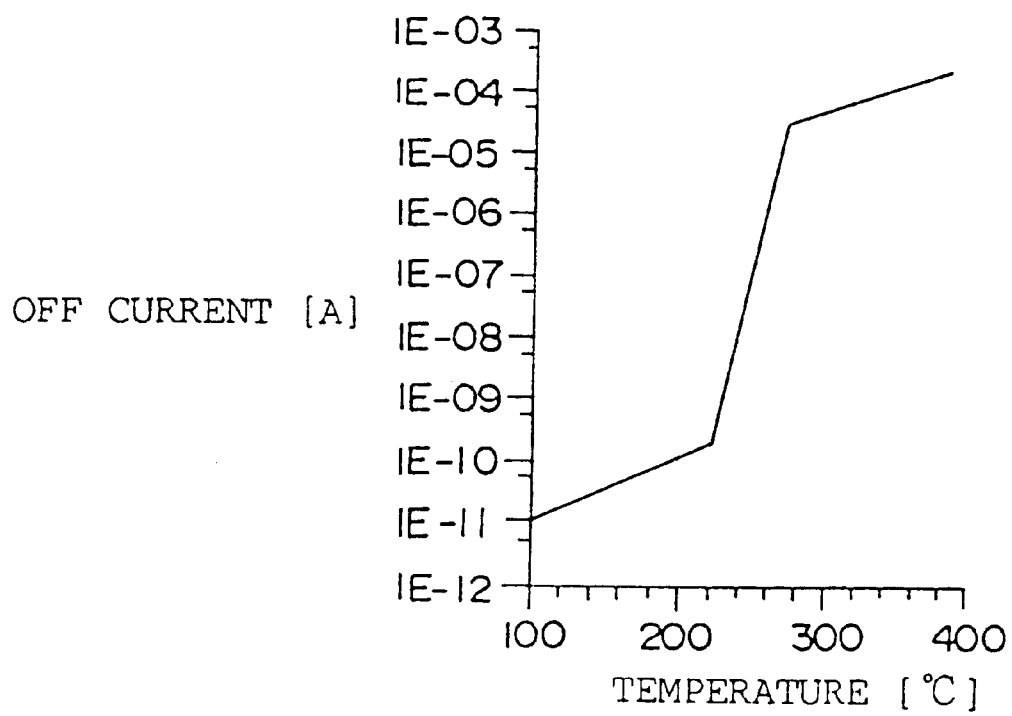
FIG. 28 is a characteristic diagram showing the relationship between deposition temperature of a silicon nitride film and off-current of a TFT provided with the silicon nitride film.

From FIG. 27, it is found that the concentration of the phosphorus remaining on the silicon nitride film surface after selective deposition decreases as the silicon nitride deposition temperature lowers. Thereby, it is possible to estimate that the quantity of silicon on the silicon nitride film surface also decreases.

Moreover, as the result of examining the relationship between the silicon nitride film deposition temperature and TFT off-current, it is found that the off-current decreases to $1 \times 10^{-10}$ A or less when the deposition temperature decreases to 220° C. or lower and the deposition temperature of 220° C. or lower is preferable. However, to apply the film to a liquid crystal display device, the deposition temperature of 100° C. or lower is optimum in which the off-current comes to $1 \times 10^{-11}$ A or less.

As described above, when silicon is selectively deposited on the source electrode 127s and drain electrode 127d up to the thickness of 30 Å by using the silicon nitride film 126 formed at the temperature of 100° C. as a substrate insulator, the time for one cycle of deposition and etching can be decreased up to approx. 20 sec. In this case, the deposition time is 3 sec.

For this embodiment, it is described that the substrate temperature for forming the substrate insulator is lowered in order to increase the hydrogen content of the silicon nitride film. However, the hydrogen content can be decreased by deviating the ratio of $SiH_4$ to $NH_3$ of material gas from the stoichiometric composition or setting a silicon nitride film in hydrogen plasma before forming source and drain electrodes. Though this embodiment uses a silicon nitride film for a substrate insulator, it is also possible to use a silicon oxide film containing a lot of hydrogen for it.

(9) Ninth Embodiment

For the eighth embodiment, it is described that the deposition temperature of a silicon nitride film serving as a substrate insulator of source and drain electrodes is lowered.

However, when the deposition temperature is lowered, the surface of the silicon nitride film is easily etched and a concave is formed between the source and drain electrodes.

Therefore, as shown in FIG. 25E, when an active semiconductor layer 129 is deposited after the contact layer 128 is deposited, the active semiconductor layer 129 may be cut due to the level difference between the concave 135 and the electrode thickness.

Figure 29:
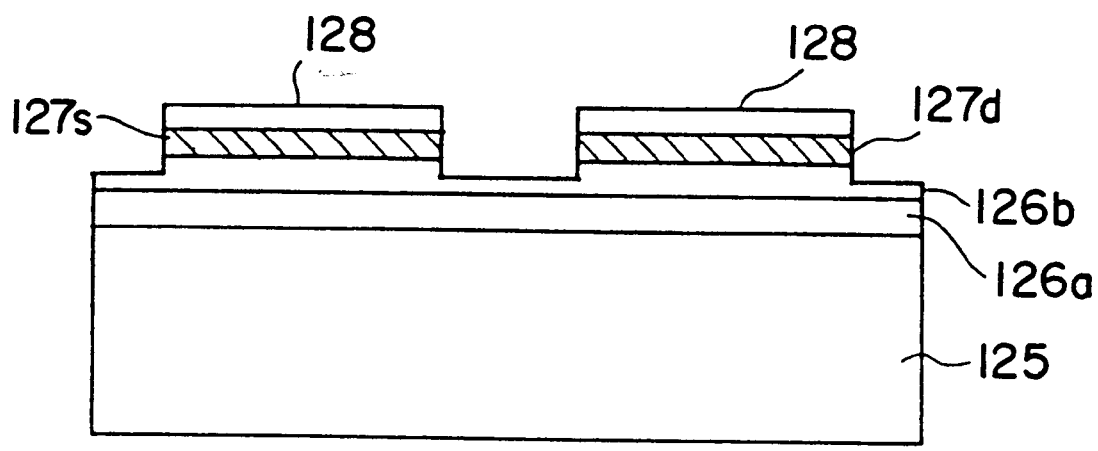
FIG. 29 is a sectional view of a stagger-type TFT of the ninth embodiment of the present invention.

Therefore, as shown in FIG. 29, the lower portion 126A of the silicon nitride film 126 is deposited at a temperature of, for example, 450° C. or higher and the higher portion 126B of the film 126 is deposited at a temperature of 220° C. or lower. Thus, it is possible to decrease the etching amount at the final stage of selective deposition of the contact layer 128, prevent a concave with an excessive depth from occurring, and improve the yield.

The thickness of the upper portion 126B is determined by estimating the depth to be etched by hydrogen plasma.

(10) Tenth Embodiment

For the above ninth embodiment, the level difference due to the concave is prevented from increasing by changing the temperatures for deposition of the substrate insulator of the source and drain electrodes. In this case, it is necessary to set the thickness of the active semiconductor layer to ½ or more the level difference from the top of the source and drain electrodes to the bottom of the concave of the substrate insulator, preferably to a value larger than the level difference.

Even if the active semiconductor layer is formed without being cut, distortion due to the level difference is applied to the active semiconductor layer and thereby the electrical characteristic is easily degraded or the mechanical strength is easily decreased.

Therefore, by forming a taper at the edges of portions adjacent to each other of source and drain electrodes, the level difference which the active semiconductor layer gets over decreases and the distortion due to the level difference on the active semiconductor layer is decreased. The angle of the tapered portion should be 10° or more from the vertical line, particularly 40° is optimum.

The following is the brief description of a method for forming the tapered portion.

First, as shown in FIG. 25A, the chromium film 127 is patterned by using a resist pattern RP as a mask to form the source electrode 127s and drain electrode 127d and thereafter nitric acid is added to the etching solution or the mixed solution of ammonium cerium (IV) nitrate and perchloric acid, then the edge of the resist pattern appears. As a result, the etching solution enters the gap between the source electrode 127s and drain electrode 127d on one hand and the resist pattern RP on the other and the tapered portion 136 is formed on the side of the electrodes 127s and 127d as shown in FIG. 30.

Figure 30:
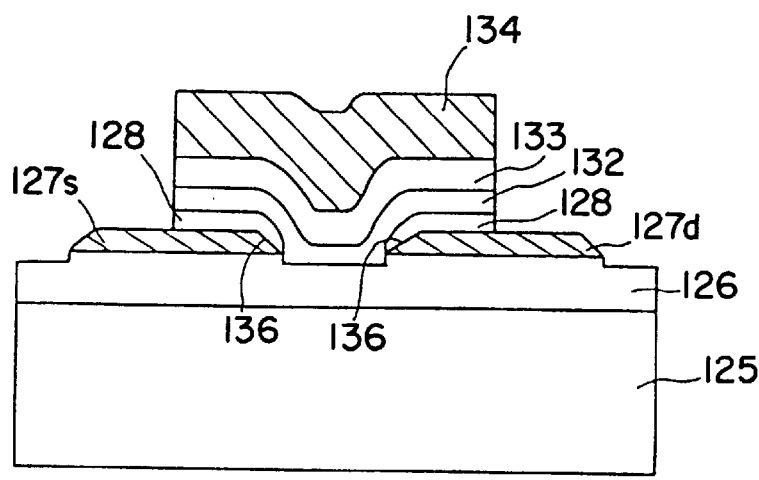
FIG. 30 is a sectional view of a stagger-type TFT of the tenth embodiment of the present invention.

In FIG. 30, the same symbol as that in FIG. 25F shows the same element.

The so-called triode region of an insulating-gate-type field effect transistor is important to drive a liquid crystal display unit. Particularly, because the region is one of the factors for determining the gradation and resolution to realize display of the unit. Therefore, it is desirable to obtain a drain current as large as possible.

Figure 31:
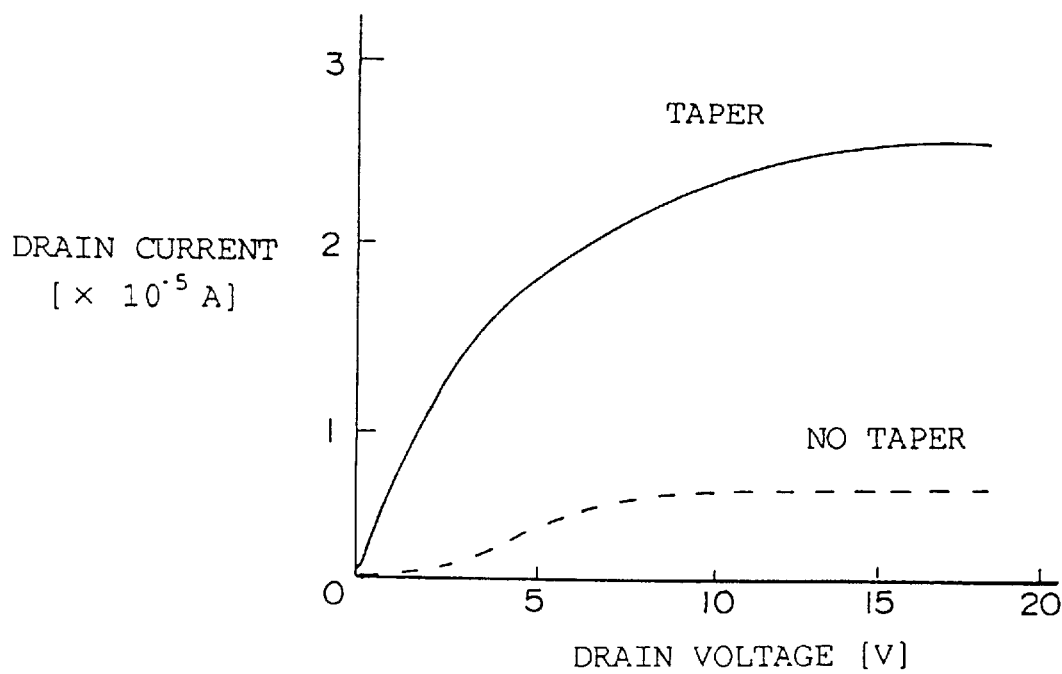
FIG. 31 is a characteristic diagram showing the relationship between drain current and drain voltage for explaining the stagger-type TFT of the tenth embodiment of the present invention.

As the result of examining the drain-voltage and drain-current characteristic on the cases in which the tapered portion 136 is formed on the electrodes 127s and 127d and it is not formed on them, the characteristic shown in FIG. 31 is obtained. The triode region in the characteristic diagram is the region where the drain voltage ranges from 0 to 5V.

As the result of setting the angle of the tapered portion of the source electrode 127s and drain electrode 127d to 40°, the characteristic shown by a continuous line in FIG. 31 is obtained, a linear characteristic is obtained in the triode region, and moreover, the drain current value comes to approx. $2 \times 10^{-6}$ A at the drain voltage of 5V.

However, as the result of setting no tapered portion on the electrodes 127s and 127d by keeping the depth of the concave 136 same, the characteristic shown by a broken line in FIG. 31 is obtained, a non-linear characteristic is obtained in the triode region, and the drain current does not reach $1 \times 10^{-5}$ A.

Thus, for this embodiment, it is clarified that the thin-film transistor driving capacity is improved by forming a taper at the edges of source and drain electrodes.

(11) Eleventh Embodiment

For the tenth embodiment, a taper is formed at the edges of source and drain electrodes to decrease the distortion of a active semiconductor layer. However, the effect is further improved by forming a taper at the edge of a concave formed on the substrate insulator of source and drain electrodes. The following is the description of a method for forming the taper.

Figure 32A:
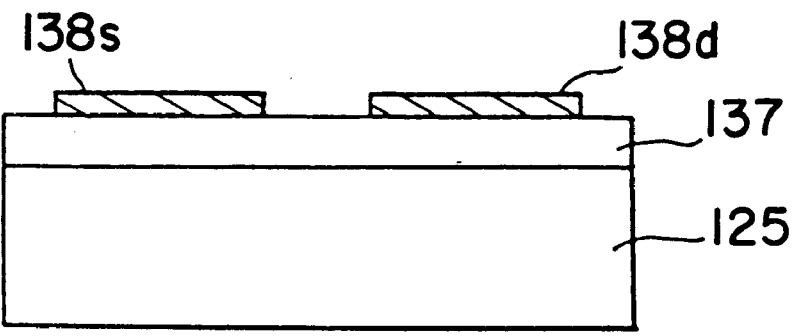
FIGS. 32A to 32C are sectional views showing the step of fabricating a stagger-type TFT of the eleventh embodiment of the present invention.

First, as shown in FIG. 32A, a substrate insulating film 137 made of $SiO_2$ having a large hydrogen content is formed on a transparent substrate 125 up to the thickness of 3,000 Å through plasma CVD and an ITO film is formed on the film 137 up to the thickness of 1,000 Å. Thereafter, the ITO film is patterned through photolithography to form a source electrode 138s, drain electrode 138d, and picture-element electrode (not illustrated).

Figure 32B:
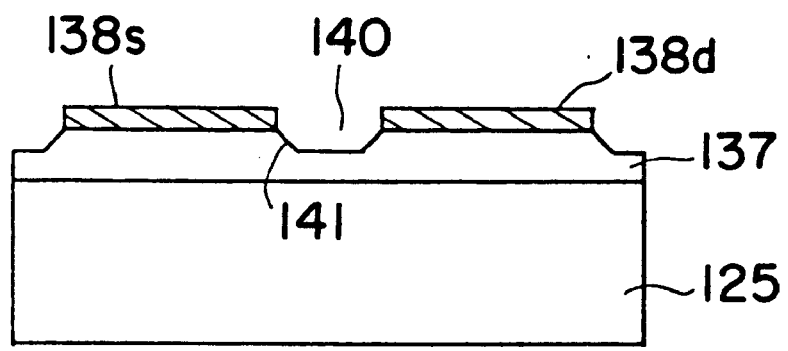

Then, a concave 140 is formed by using the source electrode 138s and drain electrode 138d as masks and slightly decreasing the thickness of the substrate insulating film 137 through reactive ion etching (RIE). In this case, $CHF_3$ is introduced into an etching chamber at the flow rate of 200 sccm to set the chamber pressure to 0.04 Torr and decrease the substrate temperature to 100° C. or lower. As a result, as shown FIG. 32B, an insulating material ($SiO_2$) sublimated due to etching attaches to the side wall of the concave 140 of the substrate insulating film 135 and a tapered side-wall protective film 141 is formed on the side wall because of the substrate cooling effect.

The above side etching also has an effect for decreasing the contamination of the surface of the substrate insulating film 137 between the source electrode 138s and drain electrode 138d.

Then, a contact layer 142 is selectively deposited on the source electrode 128s and drain electrode 138d by repeating the cycle of deposition and etching as described in the first embodiment.

Then, an active semiconductor layer 143 made of amorphous silicon is formed through CVD. In this case, because a taper is formed at the edge of the concave 140, distortion due to level difference hardly occurs in the active semiconductor layer 143.

Figure 32C:
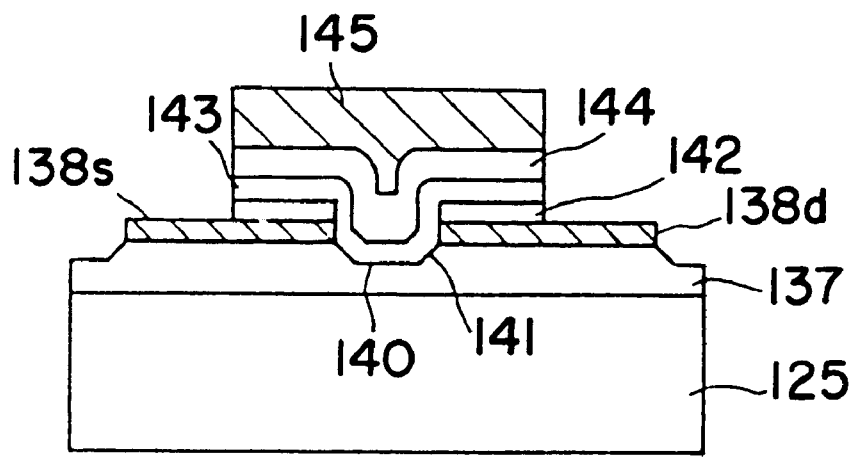
Figure 33:
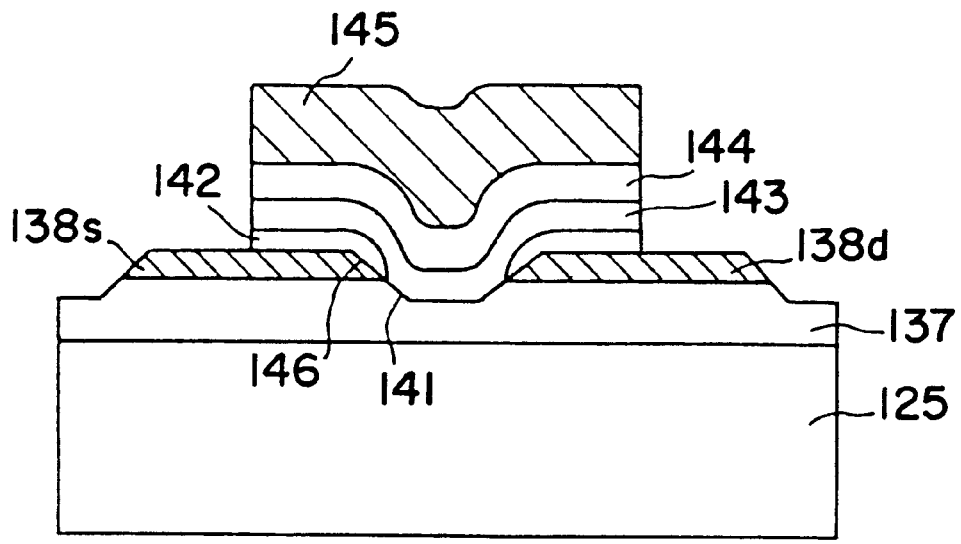
FIG. 33 is a sectional view of another structure of the stagger-type TFT of the eleventh embodiment of the present invention.

Thereafter, as shown FIG. 32C a gate insulating film 144 and gate electrode 145 are formed. However, the details are omitted because they are the same as those of the first embodiment.

Though it is described above that the tapered side-wall protective film 141 is formed on the concave 140 of the substrate insulating film 137, it is also possible to form a tapered portion 146 at the sidewall of the source electrode 138s and drain electrode 138d. Thereby, decrease of the thickness of the active semiconductor layer 143 is further prevented and distortion is further decreased.

It is also possible to form the substrate insulating film 137 with silicon nitride. When using SiNx deposited at a low temperature, selective deposition of a contact layer is efficiently performed as described in the first embodiment. For this embodiment, source and drain electrodes use ITO. However, it is also possible to use other conductive film.

Moreover, when the substrate insulating 137 is made of silicon oxide, it is possible to form an SiNx film to be easily etched through hydrogen plasma on the surface of the substrate insulating film 137.

(12) Twelfth Embodiment

For the above eighth to eleventh embodiments, description is made on a substrate insulator used for a stagger-type TFT. However, it is also possible to decrease the off-current between a source and drain by using an insulating film having a large hydrogen content for a inverted-stagger-type TFT.

Figure 34:
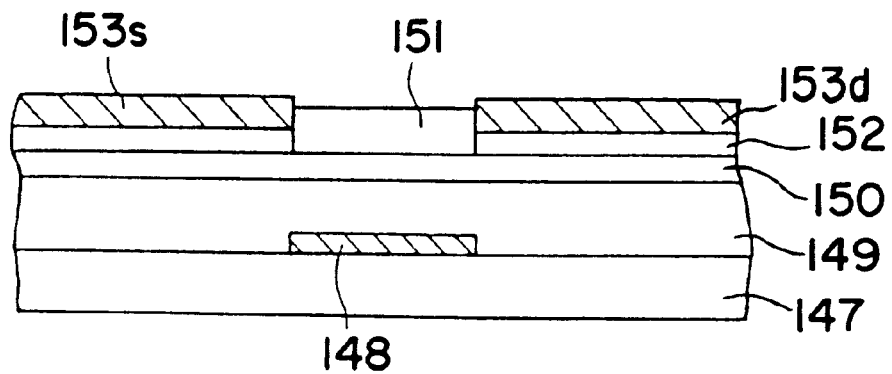
FIG. 34 is a sectional view of a inverted-stagger-type TFT of the twelfth embodiment of the present invention.

The step of selectively depositing a contact layer of a inverted-stagger-type TFT is described below by referring to FIG. 34.

The TFT comprises a gate electrode 148 formed on a substrate 147 such as a transparent substrate or silicon nitride film, a gate insulating film 149 for covering the gate electrode 148, and an active semiconductor layer 150 laminated on the gate insulating film 148. The step of forming a contact layer starts with the above state.

To form the contact layer, the channel region of the active semiconductor layer 150 is covered with a channel protective film 151. The channel region is located above the gate electrode 148.

Then, silicon containing impurities is selectively deposited on the active semiconductor layer 150 of the region not covered with the channel protective film 151. The selective deposition of silicon uses the method for repeating deposition and etching whose details are previously described.

For the selective deposition of silicon, the off-current between the source and drain at the both sides of the channel protective film 151 increases because silicon remains on the channel protective film 151 if the deposition temperature of silicon nitride constituting the channel protective film 151 is raised to, for example, 400° C.

Therefore, the deposition temperature of silicon nitride constituting the channel protective film 151 is set to 280° C. or lower, preferably to 100° C. or lower to increase the hydrogen content of the silicon nitride so that silicon does not remain on the channel protective film 151 in selective deposition. The silicon film thus formed serves as a contact layer 152.

Then, a conductive film made of molybdenum is selectively deposited on the contact layer 152 to pattern the range from the conductive film to the active semiconductor layer 150 and form a source electrode 153s and drain electrode 153d made of the conductive film.

What is claimed is:

1. A method for fabricating a thin-film transistor, comprising the steps of:

forming a gate electrode on a substrate insulator;

forming a gate insulating film for covering the gate electrode;

laminating an active semiconductor layer on the gate insulating film;

forming an insulating channel protective film through lithography using a resist pattern as a mask, wherein the resist pattern is formed through an exposure step of applying light from a side having the substrate insulator by using the gate electrode as a mask;

forming a contact layer at both sides of the insulating channel protective film, wherein the contact layer is made of the active semiconductor layer in a region in which impurities are introduced from outside by using the insulating channel protective film as a mask;

etching surfaces of the contact layer and the insulating channel protective film with hydrogen or halogen plasma at a temperature of no greater than 200° C.; and selectively depositing a conductive material by sticking said conductive material on the contact layer to form a source electrode and a drain electrode wherein light for activating is irradiated to the active semiconductor layer in the region in which impurities are introduced from the outside.

2. A method for fabricating a thin-film transistor according to claim 1, wherein the etching step is performed under a pressure substantially equal to 0.1 Torr.

3. A method for fabricating a thin-film transistor according to claim 1, wherein the conductive material is selected from a group consisting of tungsten, molybdenum, titanium, tantalum, aluminum, and refractory metal silicide.

4. A method for fabricating a thin-film transistor, comprising:

forming a gate electrode on a substrate insulator;

forming a gate insulating film covering the gate electrode;

laminating an active semiconductor layer on the gate insulating film;

forming an insulating channel protective film through lithography using a resist pattern as a mask, wherein the resist pattern is formed through an exposure step of applying light from a side having the substrate insulator by using the gate electrode as a mask;

forming a contact layer at both sides of the insulating channel protective film, wherein the contact layer is made of an impurity-contained semiconductor film selectively deposited on the active semiconductor layer by repeating deposition and etching in making use of the difference of deposition rate due to a deposition base; and selectively depositing a conductive material on the contact layer so as to form a source electrode and a drain electrode wherein light for activating is irradiated to the active semiconductor layer when selectively depositing the impurity-contained semiconductor film on the active semiconductor layer.

5. A method for fabricating a thin-film transistor according to claim 4, further comprising etching a surface of the active semiconductor layer which is not covered with a channel protective film, with hydrogen or halogen plasma at a temperature no greater than 200° C. before forming the contact layer.

6. A method for fabricating a thin-film transistor according to claim 4, wherein a material gas containing a silicon compound and impurities is used for the deposition and at least one of such gases as hydrogen, helium, neon, argon, krypton, and xenon is used for the etching in the step of selectively depositing the impurity-contained semiconductor film.

7. A method for fabricating a thin-film transistor according to claim 4, wherein a discharge electrode supporting the substrate insulator is connected to an earth for the deposition and the discharge electrode is connected to one of a radio-frequency power supply and a direct current power supply for the etching in the step of selectively depositing the impurity-contained semiconductor film.

8. A method for fabricating a thin-film transistor according to claim 4, wherein the etching in the step of selectively depositing the impurity-contained semiconductor film is performed through plasma treatment containing hydrogen or halogen under a pressure at a temperature of no greater than 200° C.

9. A method for fabricating a thin-film transistor according to claim 4, wherein selective deposition of the conductive material and that of the semiconductor layer are continuously performed without being exposed to an outer atmosphere.

10. A method for fabricating a thin-film transistor according to claim 4, wherein the channel protective film is made up of an insulating which is made of silicon nitride chemical-vapor-deposited at a temperature not greater than 200° C.

11. A method for fabricating a thin-film transistor according to claim 4, wherein the temperature of the substrate insulator for the etching in the step of selectively depositing the impurity-contained semiconductor film is 200° C. or lower, and the temperature of the substrate insulator for the deposition is equal to or higher than that for the etching in the step of selectively depositing the impurity-contained semiconductor film.

* * * * *